(12) United States Patent
Lee et al.

(10) Patent No.: US 11,251,412 B2
(45) Date of Patent: Feb. 15, 2022

(54) ORGANIC LIGHT EMITTING DISPLAY DEVICE AND A METHOD OF MANUFACTURING ORGANIC LIGHT EMITTING DISPLAY DEVICE

(71) Applicant: SAMSUNG DISPLAY CO., LTD., Yongin-si (KR)

(72) Inventors: Jeongho Lee, Seoul (KR); Yanghee Kim, Yongin-si (KR); Juncheol Shin, Asan-si (KR); Hokyoon Kwon, Seoul (KR); Deukjong Kim, Cheonan-si (KR); Keunsoo Lee, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/877,048

(22) Filed: May 18, 2020

(65) Prior Publication Data
US 2020/0287170 A1 Sep. 10, 2020

Related U.S. Application Data

(63) Continuation of application No. 15/952,885, filed on Apr. 13, 2018, now Pat. No. 10,658,628.

(30) Foreign Application Priority Data

May 29, 2017 (KR) .......................... 10-2017-0065883

(51) Int. Cl.
*H01L 51/56* (2006.01)
*H01L 51/52* (2006.01)
(Continued)

(52) U.S. Cl.
CPC .......... *H01L 51/56* (2013.01); *H01L 27/3258* (2013.01); *H01L 27/3276* (2013.01);
(Continued)

(58) Field of Classification Search
CPC . H01L 51/56; H01L 51/0097; H01L 51/5253; H01L 2251/5338; H01L 27/3258; H01L 27/3276; H01L 27/3279
See application file for complete search history.

(56) References Cited

U.S. PATENT DOCUMENTS 9,287,329 B1 * 3/2016 Lee ..................... H01L 27/1218
9,287,342 B2 3/2016 Kwon et al.
(Continued)

FOREIGN PATENT DOCUMENTS

KR 10-2015-0074808 7/2015
KR 1020160124286 10/2016
(Continued)

*Primary Examiner* — Aaron J Gray
(74) *Attorney, Agent, or Firm* — F. Chau & Associates, LLC

(57) ABSTRACT

An organic light emitting display device includes a substrate. A buffer layer is disposed on the substrate. The buffer layer includes a first opening exposing an upper surface of the substrate in a bending region. Pixel structures are positioned in a pixel region on the buffer layer. A fan-out wiring is positioned in the peripheral region and the pad region on the insulation layer structure such that the upper surface of the substrate and the first portion of the buffer layer are exposed. A passivation layer is disposed on the fan-out wiring, side walls of the insulation layer structure adjacent to the bending region, and the first portion of the buffer layer. The passivation layer includes a third opening exposing the upper surface of the substrate in the bending region. A connection electrode is positioned in the bending region on the substrate.

40 Claims, 28 Drawing Sheets

(51) Int. Cl.
*H01L 51/00* (2006.01)
*H01L 27/32* (2006.01)

(52) U.S. Cl.
CPC ...... *H01L 27/3279* (2013.01); *H01L 51/0097* (2013.01); *H01L 51/5253* (2013.01); *H01L 2227/323* (2013.01); *H01L 2251/301* (2013.01); *H01L 2251/5338* (2013.01)

(56) References Cited

U.S. PATENT DOCUMENTS

| | | | |
|---|---|---|---|
| 10,270,059 B2 | 4/2019 | Kim | |
| 10,658,628 B2* | 5/2020 | Lee | H01L 51/5253 |
| 2015/0090980 A1* | 4/2015 | Lee | H01L 27/1259 257/40 |
| 2015/0179728 A1* | 6/2015 | Kwon | H01L 27/3276 257/40 |
| 2016/0190522 A1 | 6/2016 | Lee et al. | |
| 2016/0270209 A1* | 9/2016 | Cho | H01L 51/5203 |
| 2017/0077447 A1* | 3/2017 | Kang | H01L 27/3246 |
| 2017/0237025 A1* | 8/2017 | Choi | H01L 51/56 257/40 |
| 2017/0262109 A1* | 9/2017 | Choi | H01L 51/5253 |
| 2018/0342707 A1 | 11/2018 | Lee et al. | |
| 2019/0164995 A1* | 5/2019 | Lee | H01L 27/3276 |

FOREIGN PATENT DOCUMENTS

| | | |
|---|---|---|
| KR | 10-2017-0024200 | 3/2017 |
| KR | 1020170115150 | 10/2017 |

* cited by examiner

FIG. 1A
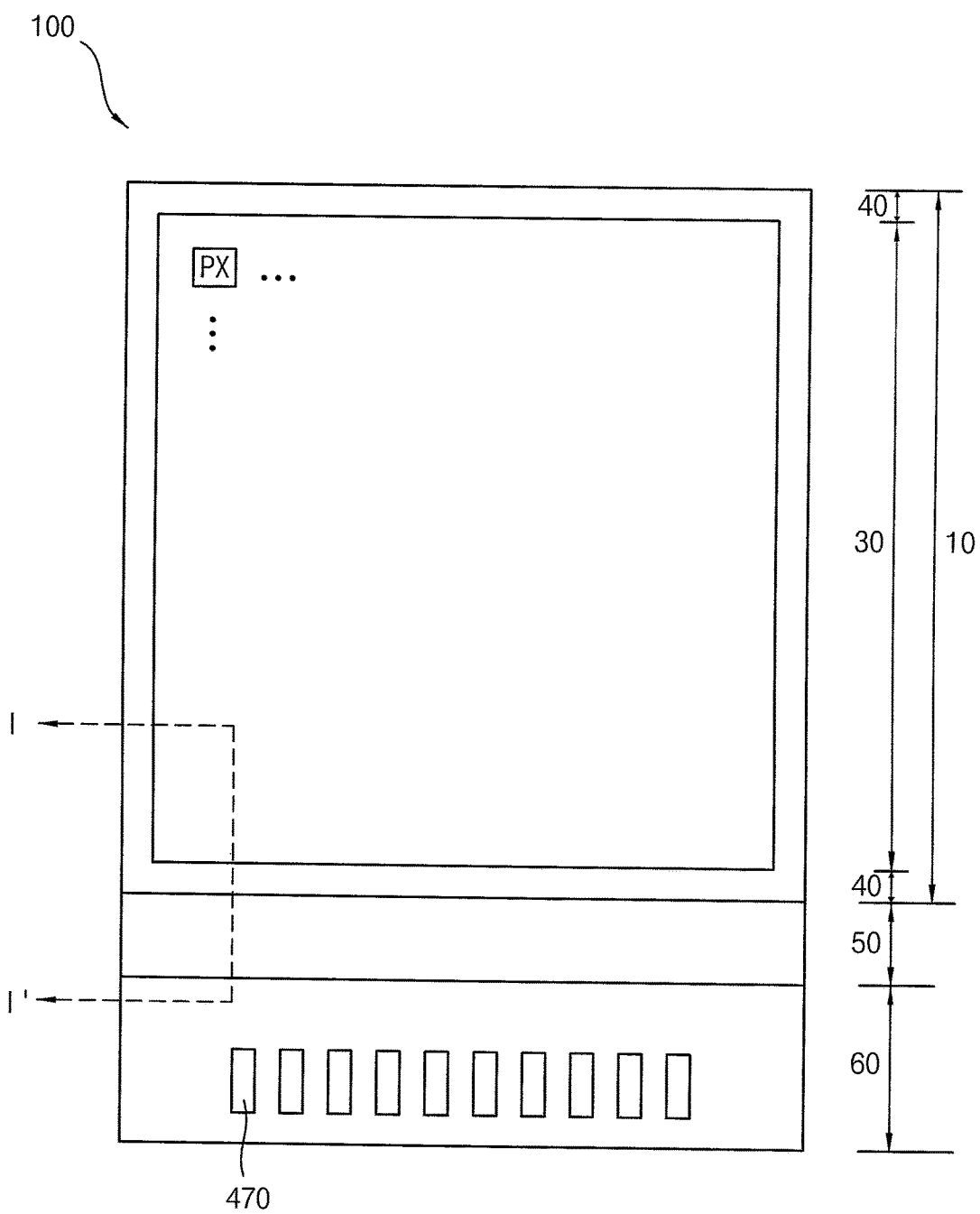
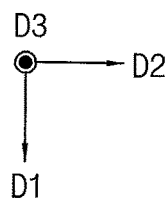

FIG. 5
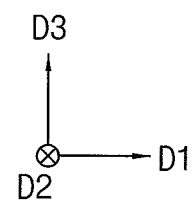
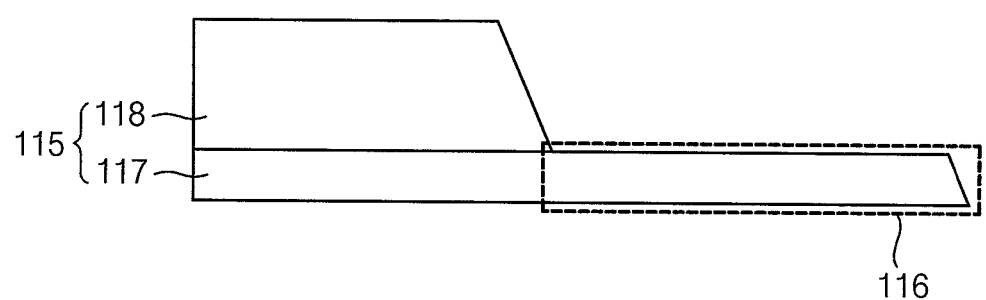

FIG. 10
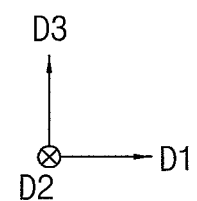
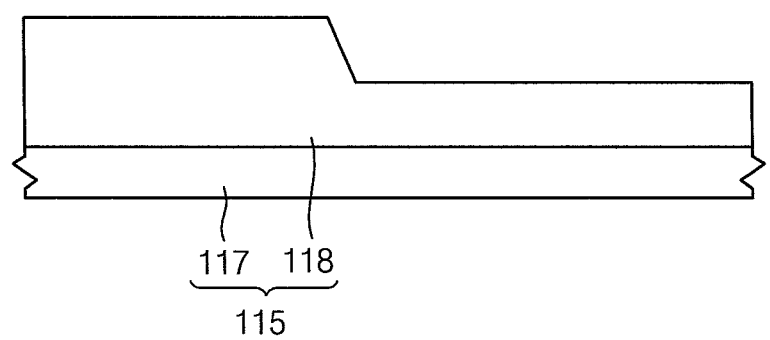

FIG. 15
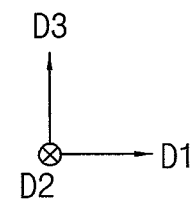
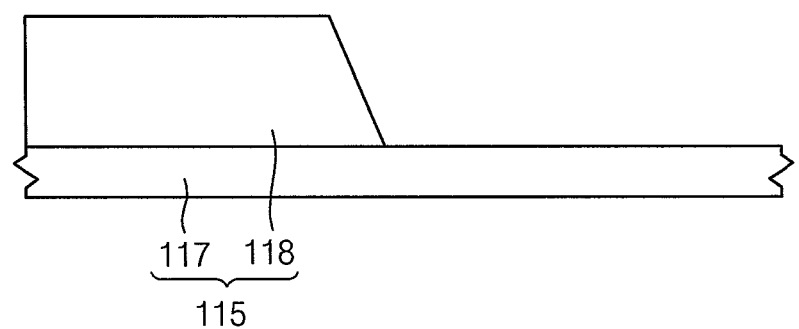

ORGANIC LIGHT EMITTING DISPLAY DEVICE AND A METHOD OF MANUFACTURING ORGANIC LIGHT EMITTING DISPLAY DEVICE

CROSS-REFERENCE TO RELATED APPLICATION

This application is a Continuation of co-pending U.S. patent application Ser. No. 15/952,885, filed on Apr. 13, 2018, which claims priority under 35 USC § 119 to Korean Patent Applications No. 10-2017-0065883, filed on May 29, 2017 in the Korean Intellectual Property Office (KIPO), the disclosures of which are incorporated by reference herein in their entirety.

1. Technical Field

Exemplary embodiments of the present invention relate to an organic light emitting display device, and more particularly to a method of manufacturing an organic light emitting display device.

2. Discussion of Related Art

A flat panel display (FPD) device may be used as a display device of an electronic device. The FPD device may be relatively lightweight and relatively thin compared to a cathode-ray tube (CRT) display device. Examples of the FPD device include a liquid crystal display (LCD) device and an organic light emitting display (OLED) device.

A flexible OLED device may be capable of bending or folding a portion of the OLED device by including lower and upper substrates, which have flexible materials. For example, the lower substrate included in the display panel may be formed of a flexible substrate, and the upper substrate included in the display panel may have a thin film encapsulation structure. A mask process that removes inorganic insulation layers disposed in a portion where the OLED device is bent such that the OLED device is readily bent may be performed.

SUMMARY

An exemplary embodiment of the present invention provides an organic light emitting display device capable of removing inorganic insulation layers that are located in a bending region.

An exemplary embodiment of the present invention provides a method of manufacturing an organic light emitting display device capable of reducing the number of a mask processes.

According to an exemplary embodiment of the present invention, an organic light emitting display (OLED) device includes a substrate including a display region including a pixel region and a peripheral region surrounding the pixel region. A pad region is spaced apart from the display region, and a bending region that is positioned between the display region and the pad region. The buffer layer is disposed on the substrate. The buffer layer includes a first opening exposing an upper surface of the substrate that is positioned in the bending region. Pixel structures are positioned in the pixel region on the buffer layer. An insulation layer structure is disposed on the buffer layer. The insulation layer structure includes a second opening exposing an upper surface of the substrate that is positioned in the bending region and a first portion of the buffer layer that is positioned adjacent to the bending region. The fan-out wiring is positioned in the peripheral region and the pad region on the insulation layer structure such that the upper surface of the substrate and the first portion of the buffer layer are exposed. A passivation layer is disposed on the fan-out wiring, side walls of the insulation layer structure that is positioned adjacent to the bending region, and the first portion of the buffer layer. The passivation layer includes a third opening exposing the upper surface of the substrate that is positioned in the bending region. A connection electrode is positioned in the bending region on the substrate, and is in direct contact with the fan-out wiring. The connection electrode is electrically connected to the pixel structure and an external device.

In an exemplary embodiment of the present invention, the first portion of the buffer layer may be protruded from the side walls of the insulation layer structure along a direction parallel to the upper surface of the substrate, and a second portion of the buffer layer may overlap the insulation layer structure along a direction orthogonal to the upper surface of the substrate.

In an exemplary embodiment of the present invention, a thickness of the first portion of the buffer layer along the direction orthogonal to the upper surface of the substrate may be less than a thickness of the second portion of the buffer layer along the direction orthogonal to the upper surface of the substrate.

In an exemplary embodiment of the present invention, the buffer layer may include a first inorganic layer disposed on the substrate and a second inorganic layer disposed on the first inorganic layer. The first portion of the buffer layer may include the first inorganic layer, and the second portion of the buffer layer may include the first and second inorganic layers.

In an exemplary embodiment of the present invention, the first inorganic layer includes silicon nitride, and the second inorganic layer includes silicon oxide.

In an exemplary embodiment of the present invention, the substrate may include a first organic layer, a first barrier layer disposed on the first organic layer, a second organic layer disposed on the first barrier layer, and a second barrier layer disposed on the second organic layer.

In an exemplary embodiment of the present invention, the second barrier layer may include a fourth opening that exposes an upper surface of the second organic layer in the bending region.

In an exemplary embodiment of the present invention, the OLED device may further include a first planarization layer positioned between the substrate and the connection electrode, and the first planarization layer may be direct contact with the upper surface of the second organic layer in the bending region.

In an exemplary embodiment of the present invention, the first and second barrier layers may each include silicon oxide, and the first and second organic layers may each include a polyimide-based resin.

In an exemplary embodiment of the present invention, the second opening may overlap the first and third openings along a direction orthogonal to the upper surface of the substrate. A width of the second opening along a direction parallel to the upper surface of the substrate may be greater than widths of the first and third openings along the direction parallel to the upper surface of the substrate.

In an exemplary embodiment of the present invention, the width of the first opening may be less than the width of the third opening along the direction parallel to the upper surface of the substrate.

In an exemplary embodiment of the present invention, the passivation layer may include a first contact hole that is positioned in the peripheral region and a second contact hole that is positioned in the pad region. The fan-out wiring may be in direct contact with the connection electrode through the first and second contact holes.

In an exemplary embodiment of the present invention, the fan-out wiring may include a first fan-out wiring positioned in the peripheral region and a second fan-out wiring positioned in the pad region. The first fan-out wiring may extend in a first direction from the pixel region into the pad region, and may be electrically connected to the pixel structure. The second fan-out wiring may extend in the first direction in the pad region, and may be electrically connected to the external device.

In an exemplary embodiment of the present invention, the OLED device may include a semiconductor element positioned between the buffer layer and the pixel structure. The semiconductor element may include an active layer disposed on the buffer layer, a first gate electrode disposed on the active layer, a second gate electrode disposed on the first gate electrode, and source and drain electrode disposed on the second gate electrode.

In an exemplary embodiment of the present invention, the insulation layer structure may include a gate insulation layer, a first insulating interlayer, and a second insulating interlayer. The gate insulation layer may be disposed on upper and side surfaces of the active layer in the pixel region above the buffer layer and extend in a first direction from the pixel region into the pad region, and may expose an upper surface of the substrate in the bending region. The first insulating interlayer may be disposed on upper and side surfaces of the first gate electrode in the pixel region above the gate insulation layer and extend in the first direction, and may expose the upper surface of the substrate in the bending region. The second insulating interlayer may be disposed on upper and side surfaces of the second gate electrode in the pixel region above the first insulating interlayer and extend in the first direction, and may expose the upper surface of the substrate in the bending region.

In an exemplary embodiment of the present invention, the passivation layer may be disposed on upper and side surfaces of the source and drain electrodes above the second insulating interlayer and extend in the first direction. The passivation layer may be disposed on the fan-out wiring in the peripheral adjacent to the bending region, and may expose the upper surface of the substrate in the bending region.

In an exemplary embodiment of the present invention, the source and drain electrodes and the fan-out wiring may be substantially simultaneously formed using a same material.

In an exemplary embodiment of the present invention, the pixel structure may include a lower electrode disposed on the semiconductor element, a light emitting layer disposed on the lower electrode, and an upper electrode disposed on the light emitting layer.

In an exemplary embodiment of the present invention, the OLED device may include a first planarization layer, a wiring pattern and a connection pattern, and a second planarization layer. The first planarization layer may be disposed on the passivation layer in the pixel region, and may be positioned between the connection electrode and the substrate in the bending region, the peripheral region that is positioned adjacent to the bending region, and the pad region. The wiring pattern and a connection pattern may be positioned in the pixel region on the first planarization layer. The second planarization layer may be disposed on upper and side surfaces of the wiring pattern and the connection pattern in the pixel region on the first planarization layer and extend in the first direction, and may be disposed on the connection electrode.

In an exemplary embodiment of the present invention, the lower electrode may be electrically connected to the drain electrode through the connection pattern.

In an exemplary embodiment of the present invention, the OLED device may include a thin film encapsulation structure disposed on the pixel structure. The thin film encapsulation structure may include a first thin film encapsulation layer disposed on the pixel structure and including an inorganic material, a second thin film encapsulation layer disposed on the first thin film encapsulation layer and including an organic material, and a third thin film encapsulation layer disposed on the second thin film encapsulation layer and including an inorganic material.

According to an exemplary embodiment of the present invention, a method of manufacturing an OLED device includes providing a substrate including a display region including a pixel region and a peripheral region surrounding the pixel region, a pad region that is spaced apart from the display region, and a bending region that is positioned between the display region and the pad region is provided. A buffer layer is formed on the substrate. A semiconductor element and an insulation layer structure are formed above the buffer layer such that a first opening exposing an upper surface of the substrate that is positioned in the bending region. A second opening exposing a first portion of the buffer layer that is positioned adjacent to the bending region are formed. A fan-out wiring is formed in the peripheral region and the pad region that are positioned adjacent to the bending region on the insulation layer structure such that the upper surface of the substrate that is positioned in the bending region and the first portion of the buffer layer are exposed. A passivation layer is formed on the fan-out wiring, side walls of the insulation layer structure that is positioned adjacent to the bending region, and the first portion of the buffer layer such that a third opening exposing the upper surface of the substrate that is positioned in the bending region is formed. A connection electrode is formed in the bending region above the substrate such that the connection electrode is in direct contact with the fan-out wiring. Pixel structures are formed above the semiconductor element.

In an exemplary embodiment of the present invention, forming the semiconductor element and the insulation layer structure on the buffer layer may include forming a preliminary insulation layer structure on the substrate. Forming the semiconductor element and the insulation layer structure on the buffer layer may include forming the insulation layer structure including the second opening exposing an upper surface of the buffer layer positioned in the bending region and the peripheral and pad regions that are positioned adjacent to the bending region by selectively performing a first etching process in the preliminary insulation layer structure.

In an exemplary embodiment of the present invention, a portion of the buffer layer that is exposed through the second opening may be removed via the first etching process.

In an exemplary embodiment of the present invention, the buffer layer may include a first inorganic layer disposed on the substrate and a second inorganic layer disposed on the first inorganic layer, and a portion of the second inorganic layer may be removed via the first etching process.

In an exemplary embodiment of the present invention, forming a fan-out wiring in the peripheral region and the pad region may include forming a preliminary fan-out wiring on the buffer layer that is exposed through the insulation layer structure and the second opening and forming a first pan-out wiring positioned in the peripheral region and a second pan-out wiring positioned in the pad region by selectively performing a second etching process in the preliminary fan-out wiring.

In an exemplary embodiment of the present invention, a portion of the buffer layer that is exposed through the second opening may be removed via the second etching process, and an upper surface of the first inorganic layer of the buffer layer may be exposed through the second opening.

In an exemplary embodiment of the present invention, a remaining portion of the second inorganic layer may be removed via the second etching process.

In an exemplary embodiment of the present invention, forming a passivation layer on the fan-out wiring, side walls of the insulation layer structure that is positioned adjacent to the bending region, and the first portion of the buffer layer may include forming a preliminary passivation layer on the buffer layer that is exposed through the pan-out wiring, the insulation layer structure, and the second opening. Forming a passivation layer on the fan-out wiring, side walls of the insulation layer structure that is positioned adjacent to the bending region, and the first portion of the buffer layer may include forming a first contact hole positioned in the peripheral region, a second contact hole positioned in the pad region, and the third opening exposing the upper surface of the substrate by selectively performing a third etching process in the preliminary passivation layer.

In an exemplary embodiment of the present invention, the substrate may include a first organic layer, a first barrier layer disposed on the first organic layer, a second organic layer disposed on the first barrier layer, and a second barrier layer disposed on the second organic layer.

In an exemplary embodiment of the present invention, the first inorganic layer of the buffer layer exposed through the third opening and the second barrier layer of the substrate may be removed via the third etching process, and an upper surface of the second organic layer of the substrate may be exposed through the third opening.

In an exemplary embodiment of the present invention, the first opening exposing an upper surface of the second organic layer in the buffer layer may be formed via the third etching process, and a fourth opening exposing an upper surface of the second organic layer may be formed in the second barrier layer.

In an exemplary embodiment of the present invention, the method may further include forming a first planarization layer on the passivation layer and the second barrier layer.

In an exemplary embodiment of the present invention, the first contact hole may expose an upper surface of the first fan-out wiring, and the second contact hole may expose an upper surface of the second fan-out wiring.

In an exemplary embodiment of the present invention, the first portion of the buffer layer protruded from the side walls of the insulation layer structure may be formed via the third etching process.

In an exemplary embodiment of the present invention, a portion of the buffer layer overlapping the insulation layer structure may be defined as a second portion of the buffer layer, and a thickness of the first portion of the buffer layer along a direction orthogonal to an upper surface of the substrate may be less than a thickness of the second portion of the buffer layer.

According to an exemplary embodiment of the present invention, an OLED device includes a substrate including a display region including a pixel region and a peripheral region surrounding the pixel region, a pad region that is spaced apart from the display region, and a bending region that is positioned between the display region and the pad region. The buffer layer is disposed on the substrate. The buffer layer includes a first opening exposing an upper surface of the substrate that is positioned in the bending region. Pixel structures are disposed in the pixel region on the buffer layer. An insulation layer structure is disposed on the buffer layer. The insulation layer structure includes a plurality of insulation layers and includes a second opening exposing an upper surface of the substrate that is positioned in the bending region and a first portion of the buffer layer that is positioned adjacent to the bending region. Fan-out wiring is positioned between two adjacent insulation layers among the plurality of insulation layers. The fan-out wiring is positioned in the peripheral region and the pad region that are positioned adjacent to the bending region such that the upper surface of the substrate and the first portion of the buffer layer are exposed. A conductive pattern is disposed on the insulation layer structure, and is electrically connected to the fan-out wiring. A passivation layer is on the conductive pattern, side walls of the insulation layer structure that is positioned adjacent to the bending region, and the first portion of the buffer layer. The passivation layer includes a third opening exposing the upper surface of the substrate that is positioned in the bending region. A connection electrode is in the bending region on the substrate. The connection electrode is in direct contact with the conductive pattern. The connection electrode is electrically connected to the pixel structure and an external device.

In an exemplary embodiment of the present invention, the first portion of the buffer layer may be protruded from the side walls of the insulation layer structure, and a second portion of the buffer layer may overlap the insulation layer structure. A thickness of the first portion of the buffer layer may be less than a thickness of the second portion of the buffer layer.

In an exemplary embodiment of the present invention, the OLED device may include a semiconductor element positioned between the buffer layer and the pixel structure. The semiconductor element may include an active layer disposed on the buffer layer, a first gate electrode disposed on the active layer, a second gate electrode disposed on the first gate electrode, and source and drain electrode disposed on the second gate electrode.

In an exemplary embodiment of the present invention, the insulation layer structure may include a gate insulation layer, a first insulating interlayer, and a second insulating interlayer. The gate insulation layer may be disposed on upper and side surfaces of the active layer in the pixel region above the buffer layer and extend in a first direction from the pixel region into the pad region, and may expose an upper surface of the substrate in the bending region. The first insulating interlayer may be disposed on upper and side surfaces of the first gate electrode in the pixel region above the gate insulation layer and extend in the first direction, and may expose the upper surface of the substrate in the bending region. The second insulating interlayer may be disposed on upper and side surfaces of the second gate electrode in the pixel region above the first insulating interlayer and extend in the first direction, and may cover the fan-out wiring in the peripheral region that is positioned adjacent to the bending region and expose the upper surface of the substrate in the bending region.

In an exemplary embodiment of the present invention, the insulation layer structure may include a gate insulation layer, a first insulating interlayer, and a second insulating interlayer. The gate insulation layer may be disposed on upper and side surfaces of the active layer in the pixel region above the buffer layer and extend in a first direction from the pixel region into the pad region, and may expose an upper surface of the substrate in the bending region. The first insulating interlayer may be disposed on upper and side surfaces of the first gate electrode in the pixel region above the gate insulation layer and extend in the first direction, and may cover the fan-out wiring in the peripheral region that is located adjacent to the bending region and expose the upper surface of the substrate in the bending region. The second insulating interlayer may be disposed on upper and side surfaces of the second gate electrode in the pixel region above the first insulating interlayer and extend in the first direction, and may expose the upper surface of the substrate in the bending region.

In an exemplary embodiment of the present invention, the passivation layer may be disposed on upper and side surfaces of the source and drain electrodes above the insulation layer structure and extend in the first direction. The passivation layer may be disposed on the conductive pattern in the peripheral region that is positioned adjacent to the bending region, and may expose the upper surface of the substrate in the bending region.

In an exemplary embodiment of the present invention, the second gate electrode and the fan-out wiring may be substantially simultaneously formed using a same material, and the source and drain electrodes and the conductive pattern may be substantially simultaneously formed using the same material.

In an exemplary embodiment of the present invention, the first gate electrode and the fan-out wiring may be substantially simultaneously formed using a same material, and the source and drain electrodes and the conductive pattern may be substantially simultaneously formed using a same material.

In an exemplary embodiment of the present invention, the passivation layer may include a first contact hole that is positioned in the peripheral region and a second contact hole that is positioned in the pad region. The conductive pattern may include a first conductive pattern that is positioned in the peripheral region and a second conductive pattern that is positioned in pad region. Each of the first and second conductive patterns may be in direct contact with the connection electrode through the first and second contact holes.

In an exemplary embodiment of the present invention, the fan-out wiring may include a first fan-out wiring positioned in the peripheral region and a second fan-out wiring positioned in the pad region. The first fan-out wiring may extend in a first direction from the pixel region into the pad region, and may be electrically connected to the pixel structure and the first conductive pattern. The second fan-out wiring may extend in the first direction in the pad region, and may be electrically connected to the external device.

In an exemplary embodiment of the present invention, the fan-out wiring may extend in a first direction from the pixel region into the pad region, and may be electrically connected to the pixel structure and the first conductive pattern. The second conductive pattern in the pad region may extend in the first direction, and may be electrically connected to the external device.

According to an exemplary embodiment of the present invention, an OLED device includes a substrate including a display region including a pixel region and a peripheral region surrounding the pixel region, a pad region that is spaced apart from the display region, and a bending region that is positioned between the display region and the pad region. A buffer layer is disposed on the substrate, and includes a first opening exposing an upper surface of the substrate that is positioned in the bending region. Pixel structures are positioned in the pixel region on the buffer layer. An insulation layer structure is disposed on the buffer layer. The insulation structure includes a second opening exposing an upper surface of the substrate that is positioned in the bending region and an upper surface of the substrate that is positioned adjacent to the bending region. A fan-out wiring is disposed on the insulation layer structure. The fan-out wiring exposes the upper surface of the substrate that is positioned in the bending region. A passivation layer is disposed on upper and side surfaces of the fan-out wiring. The passivation layer includes a third opening that exposes the upper surface of the substrate positioned in the bending region. A connection electrode is positioned in the bending region on the substrate. The connection electrode is in direct contact with the fan-out wiring. The connection electrode is electrically connected to the pixel structure and an external device.

In an exemplary embodiment of the present invention, the substrate may include a first organic layer, a first barrier layer disposed on the first organic layer, a second organic layer disposed on the first barrier layer, and a second barrier layer disposed on the second organic layer. The second barrier may include an opening that exposes an upper surface of the second organic layer in the bending region.

In an exemplary embodiment of the present invention, the first opening, the second opening, and the third opening may be simultaneously and integrally formed.

An OLED device according to an exemplary embodiment of the present invention removes the inorganic insulation layers that are positioned in the bending region through the first, second, and third etching processes, and thus a manufacturing cost of the OLED device may be reduced. In addition, in an exemplary embodiment of the present invention, since the insulation layer structure is not disposed in the peripheral region and the pad region that are positioned adjacent to the bending region, the bending region of the OLED device may be readily bent, and the OLED device may serve as a flexible OLED device having a shape where the bending region is bent.

A method of manufacturing the OLED device according to an exemplary embodiment of the present invention may remove the inorganic insulation layers that are positioned in the bending region through the first, second, and third etching processes, and an upper surface of the second organic layer 113 of the substrate may be exposed. Accordingly, although an additional etching process is not preformed to remove the inorganic insulation layers that are positioned in the bending region, the inorganic insulation layers that are positioned in the bending region may be removed through the first, second, and third etching processes. As a result, the number of a mask for manufacturing the OLED device may be reduced.

BRIEF DESCRIPTION OF THE DRAWINGS

A more complete appreciation of the present invention will become more apparent by describing in detail exemplary embodiments thereof with reference to the accompanying drawings, in which:

FIG. 1A is a plan view illustrating an organic light emitting display (OLED) device according to an exemplary embodiment of the present invention;

FIG. 5 is a cross-sectional view illustrating a buffer layer included in the OLED device of FIG. 4;

FIGS. 6, 7, 8, 9, 10, 11, 12, 13, 14, 15, 16, 17, 18, 19, 20, 21, 22, and 23 are cross-sectional views illustrating a method of manufacturing an OLED device according to an exemplary embodiment of the present invention;

DETAILED DESCRIPTION OF THE EMBODIMENTS

Figure 1B:
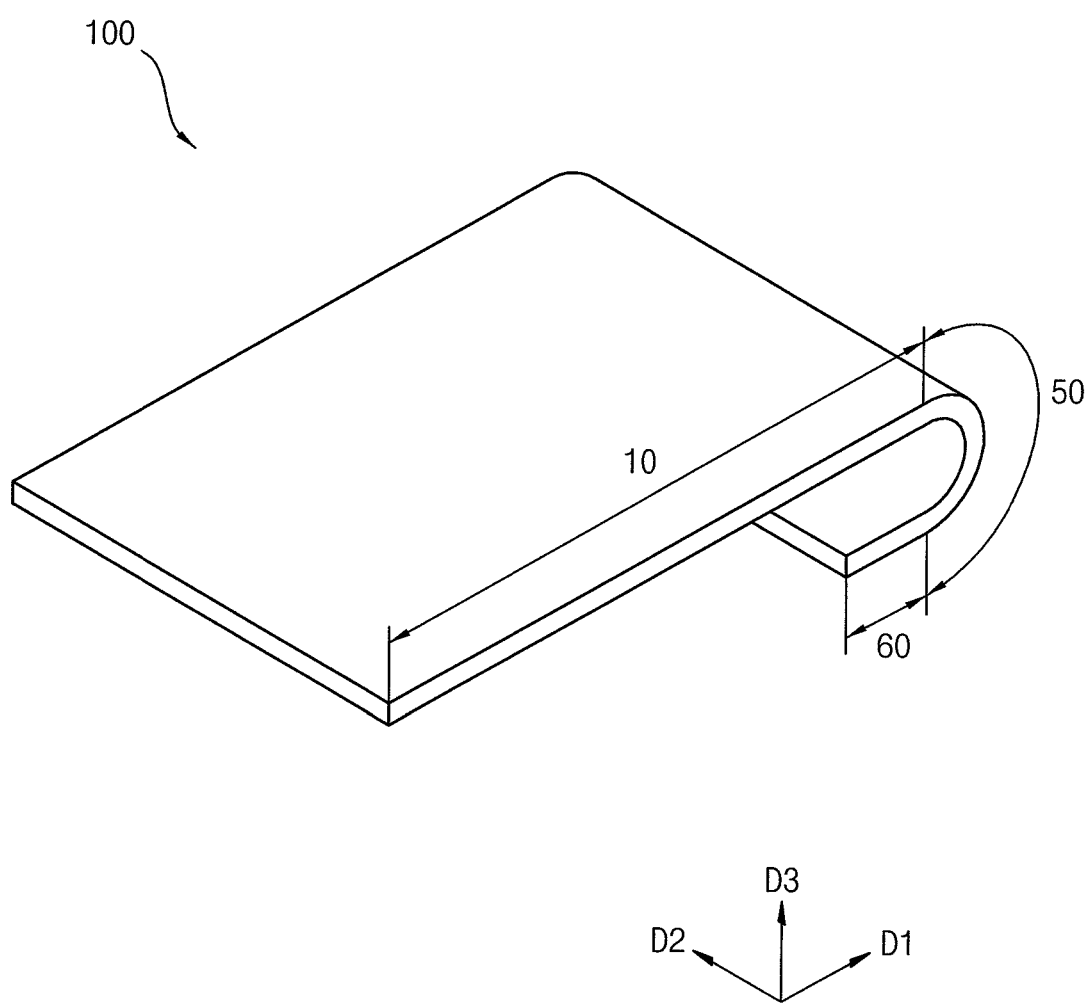
FIG. 1B is a perspective view illustrating a bent shape of the OLED device of FIG. 1A.

Exemplary embodiments of the present invention will be described below in more detail with reference to the accompanying drawings. In this regard, the exemplary embodiments may have different forms and should not be construed as being limited to the exemplary embodiments of the present invention described herein.

Like reference numerals may refer to like elements throughout the specification and drawings.

Figure 2:
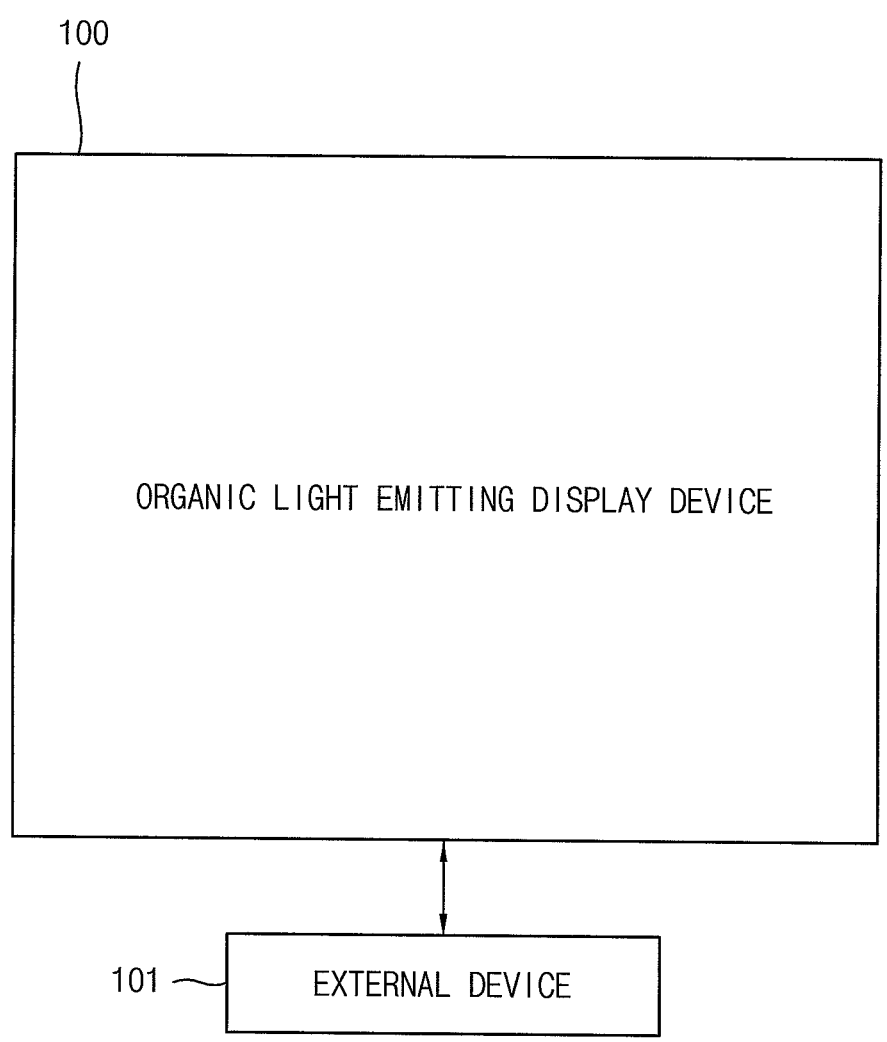
FIG. 2 is a block diagram illustrating an external device electrically connected to the OLED device of FIG. 1A.

FIG. 1A is a plan view illustrating an organic light emitting display (OLED) device according to an exemplary embodiment of the present invention. FIG. 1B is a perspective view illustrating a bent shape of the OLED device of FIG. 1A. FIG. 2 is a block diagram illustrating an external device electrically connected to the OLED device of FIG. 1A.

Referring to FIGS. 1A, 1B, and 2, an OLED device 100 may have a display region 10, a bending region 50, and a pad region 60. A plurality of pixels PX may be positioned in the display region 10, and the pad region 60 may be spaced apart from the display region 10. Pad electrodes 470 that are electrically connected to an external device 101 may be positioned in the pad region 60. The bending region 50 may be positioned between the display region 10 and the pad region 60.

The display region 10 may include a pixel region 30 where a light is emitted and a peripheral region 40 that surrounds the pixel region 30 (e.g., is positioned at four sides of the pixel region 30 when viewed in a plan view). In an exemplary embodiment of the present invention, the pixels PX (e.g., a pixel structure) emitting light may be positioned in the pixel region 30, and a plurality of wirings may be positioned in the peripheral region 40. The wirings may be electrically connected to the pad electrodes 470 and the pixels PX. For example, the wirings may include data signal wirings, scan signal wirings, light emission signal wirings, or power supply voltage wirings. A scan driver, or a data driver may be positioned in the peripheral region 40. A portion of the peripheral region 40 may be positioned between the pixel region 30 and the bending region 50.

In an exemplary embodiment of the present invention, a width and a length of the peripheral region 40 surrounding the pixel region 30 (see, e.g., FIG. 1A) may be the same, which may form a square shape of the peripheral region 40, however, exemplary embodiments of the present invention are not limited thereto. For example, the peripheral region 40 may include a first region extending in a first direction D1 that corresponds to a row direction in a plan view of the OLED device 100 and a second region extending in a second direction D2 that corresponds to a column direction in a plan view of the OLED device 100. As an example, the first region of the peripheral region 40 may be positioned in both lateral portions of the pixel region 30, and the second region of the peripheral region 40 may be positioned adjacent to the top of the pixel region 30 and the bending region 50. A width extending in the second direction D2 of the first region may be relatively less than a width extending in the first direction D1 of the second region. Alternatively, widths extending in the second direction D2 of the bending region 50 and the pad region 60 each may be less than a width extending in the second direction D2 of the display region 10. A third direction D3 extends along a direction orthogonal to the first direction D1 and the second direction D2.

Referring to FIG. 1B, as the bending region 50 is bent on an axis with respect to the second direction D2, the pad region 60 may be positioned on a lower surface of the OLED device 100. As an example, when the pad region 60 is positioned on the lower surface of the OLED device 100, the bending region 50 may have a round shape (or a bended shape). In an exemplary embodiment of the present invention, the OLED device 100 may include connection electrodes. The connection electrodes may be positioned to overlap the bending region 50 along a direction orthogonal to an upper surface of a substrate 110, and may be electrically connected to the wiring and the pad electrodes 470.

Referring to FIG. 2, the pixels PX that are positioned in the pixel region 30 may be electrically connected to the external device 101 that is electrically connected to the pad electrodes 470 through the connection electrodes that are positioned in the bending region 50 and a plurality of wirings that are positioned in the peripheral region 40. For example, the external device 101 may be electrically connected to the OLED device 100 through a flexible printed circuit board (FPCB). The external device 101 may provide a data signal, a scan signal, a light emission signal, or a power supply voltage to the OLED device 100. A driving integrated circuit may be mounted (e.g., installed) in the FPCB. In an exemplary embodiment of the present invention, the driving integrated circuit may be mounted in the OLED device 100 that is positioned adjacent to the pad electrodes 470.

Figure 3:
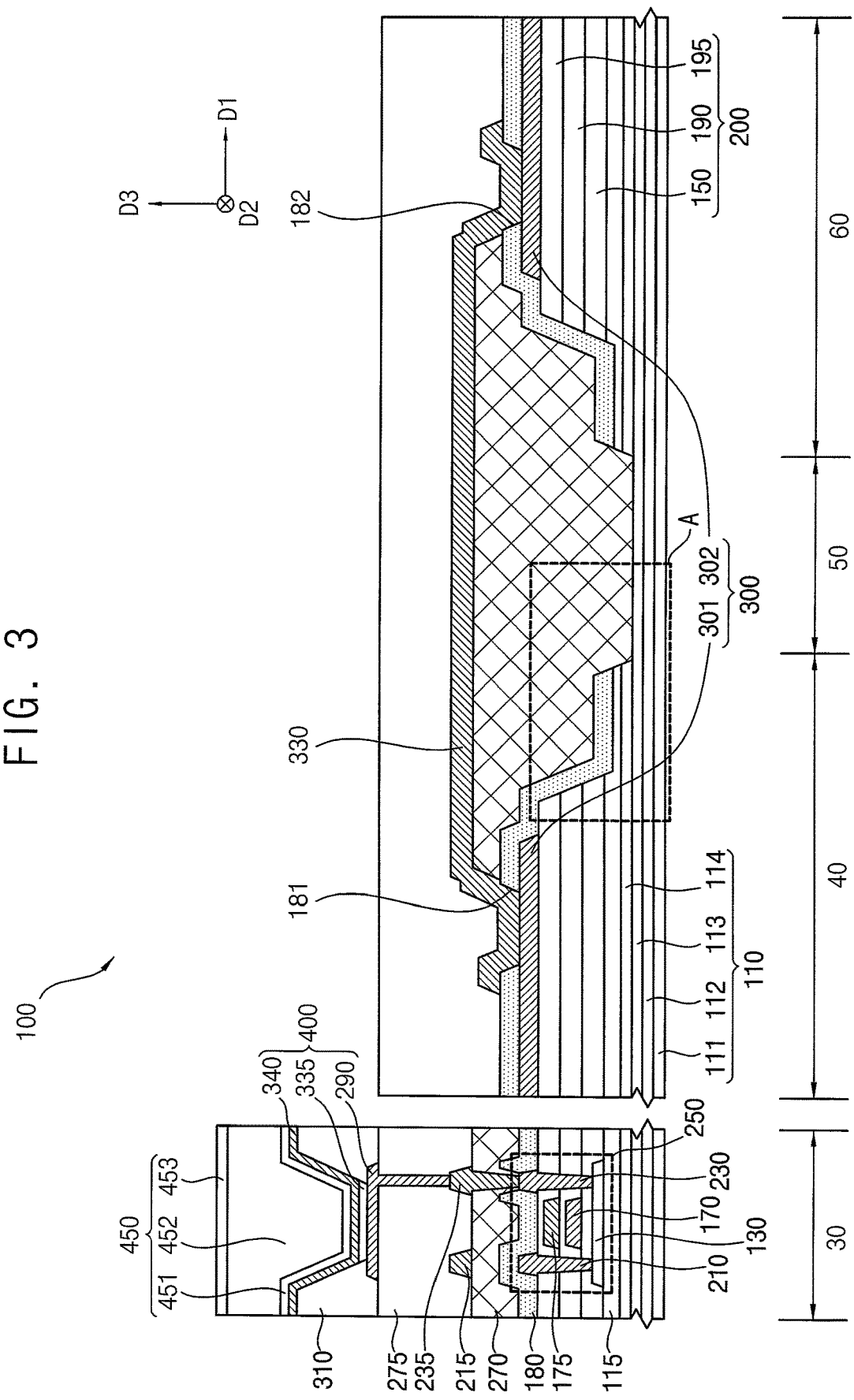
FIG. 3 is a cross-sectional view taken along a line I-I' of FIG. 1A.
Figure 4:
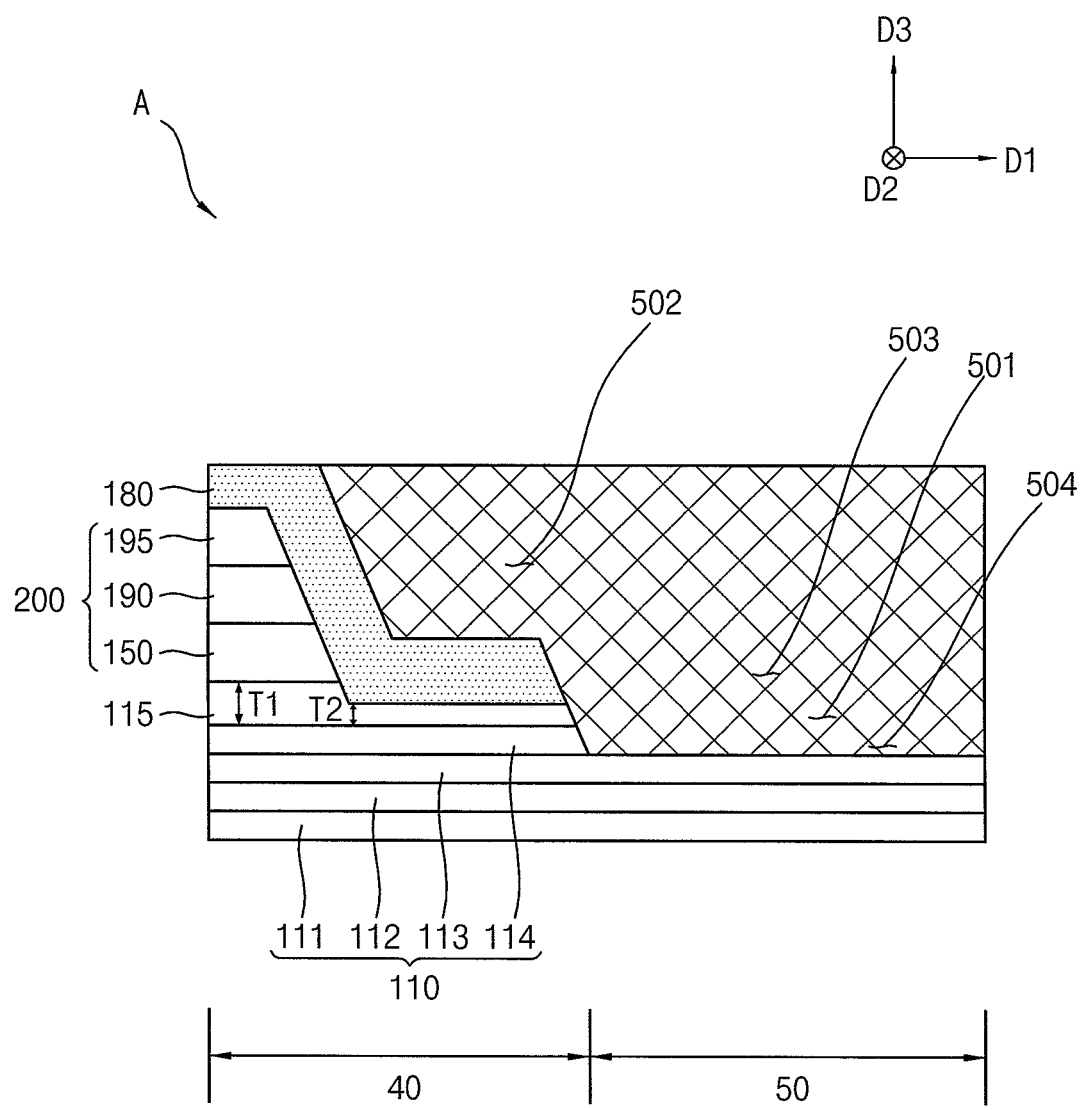
FIG. 4 is an enlarged cross-sectional view corresponding to region 'A' of FIG. 3.

FIG. 3 is a cross-sectional view taken along a line I-I' of FIG. 1A. FIG. 4 is an enlarged cross-sectional view corresponding to region 'A' of FIG. 3. FIG. 5 is a cross-sectional view illustrating a buffer layer included in the OLED device of FIG. 4.

Referring to FIGS. 3 and 4, the OLED device 100 may include a substrate 110, a buffer layer 115, an insulation layer structure 200, a semiconductor element 250, a pixel structure 400, a fan-out wiring 300, a passivation layer 180, a first planarization layer 270, a second planarization layer 275, a connection electrode 330, a wiring pattern 215, a connection pattern 235, a pixel defining layer 310, and a thin film encapsulation (TFE) structure 450. The substrate 110 may include a first organic layer 111, a first barrier layer 112, a second organic layer 113, and a second barrier layer 114, and the substrate 110 may include the pixel region 30, the peripheral region 40 (e.g., the peripheral region 40 located between the pixel region 30 and the bending region 50), the bending region 50, and the pad region 60 (see, e.g., FIG. 1A). The insulation layer structure 200 may include a gate insulation layer 150, a first insulating interlayer 190, and a second insulating interlayer 195, and the semiconductor element 250 may include an active layer 130, a first gate electrode 170, a second gate electrode 175, a source electrode 210, and a drain electrode 230. The fan-out wiring 300 may include a first fan-out wiring 301 and a second fan-out wiring 302, and the pixel structure 400 may include a lower electrode 290, a light emitting layer 335, and an upper electrode 340. The TFE structure 450 may include a first TFE layer 451, a second TFE layer 452, and a third TFE layer 453.

The OLED device 100 may include the substrate 110 and the TFE structure 450 that have a flexibility and the bending region 50 may be bent on an axis with respect to a second direction D2, and thus the OLED device 100 may serve as a flexible OLED device having a shape where the bending region 50 is bent The substrate 110 may include transparent or opaque insulation materials. The substrate 110 may include a flexible transparent resin substrate. In an exemplary embodiment of the present invention, the substrate 110 may a configuration where the first organic layer 111, the first barrier layer 112, the second organic layer 113, and the second barrier layer 114 are sequentially stacked, and the second barrier layer 114 may have a fourth opening 504 exposing an upper surface of the second organic layer 113 in the bending region 50 (see, e.g., FIG. 5). A thickness of the second barrier layer 114 may be about 1500 angstroms. As an example, the substrate 110 may have a groove in the bending region 50. The first barrier layer 112 and the second barrier layer 114 each may include inorganic materials such as a silicon compound, or a metal oxide. For example, the first barrier layer 112 and the second barrier layer 114 each may include silicon oxide (SiOx), silicon nitride (SiNx), silicon oxynitride (SiOxNy), silicon oxycarbide (SiOxCy), silicon carbon nitride (SiCxNy), aluminum oxide (AlOx), aluminum nitride (AlNx), tantalum oxide (TaOx), hafnium oxide (HfOx), zirconium oxide (ZrOx), or titanium oxide (TiOx). The first organic layer 111 and the second organic layer 113 each may include organic materials such as a photoresist, a polyacryl-based resin, a polyimide-based resin, a polyamide-based resin, a siloxane-based resin, an acryl-based resin, or an epoxy-based resin. In an exemplary embodiment of the present invention, each of the first and second barrier layers 112 and 114 may include silicon oxide, and may block moisture or water that is permeated through the first and second organic layers 111 and 113. Further, each of the first and second organic layers 11*l* and 113 may include a polyimide-based resin. The polyimide-based resin may be a copolymer or a block copolymer. The polyimide-based resin may have a relatively high transparency, a relatively low coefficient of thermal expansion, and a relatively high glass transition temperature. Since the polyimide-based resin includes imide, the polyimide-based resin may have relatively high heat resistance, relatively high chemical resistance, relatively high abrasion resistance, and relatively high electrical conduction characteristics.

Since the substrate 110 is relatively thin and flexible, the substrate 110 may be disposed on a rigid glass substrate to help support the formation of the semiconductor element 250 and the pixel structure 400. As an example, the substrate 110 may have a structure in which the first organic layer 111, the first barrier layer 112, the second organic layer 113, and the second barrier layer 114 are stacked on the rigid glass substrate. In a manufacturing method of the OLED device 100, after the buffer layer 115 is provided on the second barrier layer 114 of the substrate 110, the semiconductor element 250 and the pixel structure 400 may be disposed on the buffer layer 115. After the semiconductor element 250 and the pixel structure 400 are formed on the buffer layer 115, the rigid glass substrate on which the substrate 110 is disposed may be removed. It may be difficult to directly form the semiconductor element 250 and the pixel structure 400 on the substrate 110 because the substrate 110 is relatively thin and flexible. Thus, the semiconductor element 250 and the pixel structure 400 may be formed on the substrate 110 and the rigid glass substrate, and then the substrate 110 including the first organic layer 111, the first barrier layer 112, the second organic layer 113, and the second barrier layer 114 may serve as the substrate 110 of the OLED device 100 after the removal of the rigid glass substrate. Alternatively, the substrate 110 may include a quartz substrate, a synthetic quartz substrate, a calcium fluoride substrate, a fluoride-doped quartz substrate, a sodalime glass substrate, or a non-alkali glass substrate.

In an exemplary embodiment of the present invention, the substrate 110 may include four-layers, however, exemplary embodiments of the present invention are not limited thereto. For example, in an exemplary embodiment of the present invention, the substrate 110 may include a single layer or a plurality of layers.

The buffer layer 115 may be disposed on the substrate 110. In an exemplary embodiment of the present invention, the buffer layer 115 may be entirely disposed in the pixel region 30, the peripheral region 40, and the pad region 60 on the substrate 110, and may have a first opening 501 exposing an upper surface of the second organic layer 113 of the substrate 110 that is positioned in the bending region 50 (see, e.g., FIG. 4). A width of the first opening 501 of the buffer layer 115 along a direction parallel to the upper surface of the substrate 110 may be greater than a width of the fourth opening 504 along the direction parallel to the upper surface of the substrate 110. Referring to FIGS. 4 and 5, the buffer layer 115 may include a first portion 116 having a second thickness T2 along a direction orthogonal to the upper surface of the substrate 110 and a second portion having a second thickness T2 along the direction orthogonal to the upper surface of the substrate 110. The first portion 116 may be positioned adjacent to the bending region 50, and a first thickness T1 along the direction orthogonal to the upper surface of the substrate 110 may be greater than the second thickness T2 along the direction orthogonal to the upper surface of the substrate 110. The first thickness T1 may be about 2500 angstroms, and the second thickness T2 may be about 500 angstroms. For example, the first portion 116 of the buffer layer 115 may be protruded from side walls of the insulation layer structure 200 along the direction parallel to the upper surface of the substrate 110, and the second portion of the buffer layer 115 may overlap the insulation layer structure 200 along the direction orthogonal to the upper surface of the substrate 110. Referring to FIG. 5, the buffer layer 115 may include a first inorganic layer 117 and a second inorganic layer 118 that is disposed on the first inorganic layer 117. The first portion 116 of the buffer layer 115 may include the first inorganic layer 117, and the second portion of the buffer layer 115 may include the first inorganic layer 117 and the second inorganic layer 118.

The buffer layer 115 may prevent the diffusion of metal atoms and/or impurities from the substrate 110 into the semiconductor element 250. In addition, the buffer layer 115 may control a rate of a heat transfer in a crystallization process for forming the active layer 130, thus obtaining a substantially uniform active layer. Further, the buffer layer 115 may increase a surface flatness of the substrate 110 when a surface of the substrate 110 is relatively irregular. In an exemplary embodiment of the present invention, according to a type of the substrate 110, at least two buffer layers 115 may be provided on the substrate 110, or the buffer layer may be omitted. For example, the buffer layer 115 may include a silicon compound, or a metal oxide. In an exemplary embodiment of the present invention, the first inorganic layer 117 of the buffer layer 115 may include silicon nitride, and the second inorganic layer 118 of the buffer layer 115 may include silicon oxide.

The active layer 130 may be positioned in the pixel region 30 on the buffer layer 115. The active layer 130 may include an oxide semiconductor, an inorganic semiconductor (e.g., amorphous silicon, polysilicon, etc.), or an organic semiconductor.

The gate insulation layer 150 may be disposed on the active layer 130. The gate insulation layer 150 may cover the active layer 130 in the pixel region 30 on the buffer layer 115, and may extend in the first direction D1 from the pixel region 30 into the pad region 60. For example, the gate insulation layer 150 may be disposed on upper and side surfaces of the active layer 130 on the buffer layer 115, and may have a substantially level upper surface without a step around the active layer 130. Alternatively, the gate insulation layer 150 may cover the active layer 130 on the buffer layer 115, and may be disposed as a substantially uniform thickness along a profile of the active layer 130. Thus, a step may be formed above the active layer 130. In an exemplary embodiment of the present invention, the gate insulation layer 150 may be positioned in the pixel region 30, the peripheral region 40, and the pad region 60 on the buffer layer 115, and may have an opening exposing the upper surface of the second organic layer 113 that is positioned in the bending region 50 and the first portion 116 of the buffer layer 115. The gate insulation layer 150 may include a silicon compound, or a metal oxide.

The first gate electrode 170 may be disposed on a portion of the gate insulation layer 150 under which the active layer 130 is positioned. The first gate electrode 170 may include a metal, a metal alloy, a metal nitride, a conductive metal oxide, or transparent conductive materials. These may be used alone or in a desired combination thereof. In an exemplary embodiment of the present invention, the first gate electrode 170 may have a multi-layered structure.

The first insulating interlayer 190 may be disposed on the first gate electrode 170. The first insulating interlayer 190 may cover the first gate electrode 170 in the pixel region 30 on the gate insulation layer 150, and may extend in the first direction D1. For example, the first insulating interlayer 190 may be disposed on upper and side surfaces of the first gate electrode 170 on the gate insulation layer 150, and may have a substantially level surface without a step around the first gate electrode 170. Alternatively, the first insulating interlayer 190 may cover the first gate electrode 170 on the gate insulation layer 150, and may be disposed as a substantially uniform thickness along a profile of the first gate electrode 170. Thus, a step may be formed above the first gate electrode 170. In an exemplary embodiment of the present invention, the first insulating interlayer 190 may be positioned in the pixel region 30, the peripheral region 40, and the pad region 60 on the gate insulation layer 150, and may have an opening exposing the upper surface of the second organic layer 113 that is positioned in the bending region 50 and the first portion 116 of the buffer layer 115. The first insulating interlayer 190 may a include silicon compound, or a metal oxide.

The second gate electrode 175 may be disposed on a portion of the first insulating interlayer 190 under which the first gate electrode 170 is positioned. The first gate electrode 170 and the second gate electrode 175 may serve as a storage capacitor. The second gate electrode 175 may include a metal, a metal alloy, a metal nitride, a conductive metal oxide, or transparent conductive materials. These may be used alone or in a desired combination thereof. In an exemplary embodiment of the present invention, the second gate electrode 175 may have a multi-layered structure.

The second insulating interlayer 195 may be disposed on the second gate electrode 175. The second insulating interlayer 195 may cover the second gate electrode 175 in the pixel region 30 on the first insulating interlayer 190, and may extend in the first direction D1. For example, the second insulating interlayer 195 may be disposed on upper and side surfaces of the second gate electrode 175 on the first insulating interlayer 190, and may have a substantially level surface without a step around the second gate electrode 175. Alternatively, the second insulating interlayer 195 may cover the second gate electrode 175 on the first insulating interlayer 190, and may be disposed as a substantially uniform thickness along a profile of the second gate electrode 175. Thus, a step may be formed above the second gate electrode 175. In an exemplary embodiment of the present invention, the second insulating interlayer 195 may be positioned in the pixel region 30, the peripheral region 40, and the pad region 60 on the first insulating interlayer 190, and may have an opening exposing the upper surface of the second organic layer 113 that is positioned in the bending region 50 and the first portion 116 of the buffer layer 115. The second insulating interlayer 195 may include a silicon compound, or a metal oxide. Thus, the insulation layer structure 200 including the gate insulation layer 150, the first insulating interlayer 190, and the second insulating interlayer 195 may be positioned in the pad region 60. The opening of the gate insulation layer 150, the opening of the first insulating interlayer 190, and the opening of the second insulating interlayer 195 may be defined as a second opening 502 (see, e.g., FIG. 4). In an exemplary embodiment of the present invention, the second opening 502 may overlap the first opening 501 along the direction orthogonal to the upper surface of the substrate 110, and a width of the second opening 502 of the insulation layer structure 200 along the direction parallel to the upper surface of the substrate 110 may be greater than a width of the first opening 501 of the buffer layer 115 along the direction parallel to the upper surface of the substrate 110.

The source electrode 210 and the drain electrode 230 may be positioned in the pixel region 30 on the second insulating interlayer 195. The source electrode 210 may be in direct contact with a source region of the active layer 130 via a contact hole formed by removing a portion of the insulation layer structure 200. The drain electrode 230 may be in direct contact with a drain region of the active layer 130 via a contact hole formed by removing another portion of the insulation layer structure 200. Each of the source electrode 210 and the drain electrode 230 may include a metal, an alloy, a metal nitride, a conductive metal oxide, or transparent conductive materials. These may be used alone or in a desired combination thereof. In an exemplary embodiment of the present invention, each of the source and drain electrodes 210 and 230 may have a multi-layered structure. Accordingly, the semiconductor element 250 including the active layer 130, the first gate electrode 170, the second gate electrode 175, the source electrode 210, and the drain electrode 230 may be positioned in the pixel region 30.

In an exemplary embodiment of the present invention, the semiconductor element 250 may have a top gate structure, however, exemplary embodiments of the present invention are not limited thereto. For example, in an exemplary embodiment of the present invention, the semiconductor element 250 may have a bottom gate structure. A configuration of the semiconductor element 250 may include the gate insulation layer 150, the first insulating interlayer 190, and the second insulating interlayer 195.

The fan-out wiring 300 may be positioned in the peripheral region 40 and the pad region 60 on the insulation layer structure 200, and need not be disposed on the upper surface of the second organic layer 113 that is positioned in the bending region 50, a portion of an upper surface of the insulation layer structure 200, and the first portion 116 of the buffer layer 115 such that an upper surface of the substrate 110 and the first portion 116 of the buffer layer 115 are exposed. In an exemplary embodiment of the present invention, the fan-out wiring 300 may include the first fan-out wiring 301 and the second fan-out wiring 302. The first fan-out wiring 301 may extend along the first direction D1 in the peripheral region 40 on the insulation layer structure 200, and may electrically connected to the pixel structure 400 that is positioned in the pixel region 30. In addition, the second fan-out wiring 302 may extend along the first direction D1 in the pad region 60 on the insulation layer structure 200, and may be electrically connected to an external device 101 through pad electrodes 470 that are positioned in the pad region 60 (see, e.g., FIG. 1A).

The fan-out wiring 300 may include a metal, a metal alloy, a metal nitride, a conductive metal oxide, or transparent conductive materials. In an exemplary embodiment of the present invention, the fan-out wiring 300, the source electrode 210, and the drain electrode 230 may be substantially simultaneously formed using a same material. For example, the fan-out wiring 300 may include gold (Au), silver (Ag), aluminum (Al), platinum (Pt), nickel (Ni), titanium (Ti), palladium (Pd), magnesium (Mg), Calcium (Ca), Lithium (Li), chrome (Cr), tantalum (Ta), tungsten (W), copper (Cu), molybdenum (Mo), scandium (Sc), neodymium (Nd), Iridium (Ir), an alloy of aluminum, aluminum nitride (AlNx), an alloy of silver, tungsten nitride (WNx), an alloy of copper, an alloy of molybdenum, titanium nitride (TiNx), chrome nitride (CrNx), tantalum nitride (TaNx), strontium ruthenium oxide (SRO), zinc oxide (ZnOx), indium tin oxide (ITO), stannum oxide (SnOx), indium oxide (InOx), gallium oxide (GaOx), or indium zinc oxide (IZO). These may be used alone or in a desired combination thereof. In an exemplary embodiment of the present invention, the fan-out wiring 300 may have a multi-layered structure.

The passivation layer 180 may be disposed on the source electrode 210, the drain electrode 230, and the fan-out wiring 300. In an exemplary embodiment of the present invention, the passivation layer 180 may be disposed on upper and side surfaces of the source electrode 210 and the drain electrode 230 in the pixel region 30 on the second insulating interlayer 195, and may extend in the first direction D1. The passivation layer 180 may be disposed on the fan-out wiring 300, side walls of the insulation layer structure 200 (e.g., side wall of the second opening 502) that is positioned adjacent to the bending region 50, and the first portion 116 of the buffer layer 115 in the peripheral region 40 and the pad region 60. As an example, the passivation layer 180 may be disposed on upper and side surfaces of the first fan-out wiring 301 in the peripheral region 40 and the second fan-out wiring 302 in the pad region 60 and extend in an inner surface of the second opening 502, and may be in direct contact with the first portion 116 of the buffer layer 115.

For example, the passivation layer 180 may be disposed on upper and side surfaces of the source electrode 210, the drain electrode 230, and the fan-out wiring 300 on the second insulating interlayer 195, and may have a substantially uniform thickness along a profile of the source electrode 210, the drain electrode 230, and the fan-out wiring 300. The passivation layer 180 may cover the source electrode 210, the drain electrode 230, and the pixel region pixel region 30 on the second insulating interlayer 195, and may have a substantially level surface without a step around of the source electrode 210, the drain electrode 230, and the fan-out wiring 300. In an exemplary embodiment of the present invention, the passivation layer 180 may entirely positioned in the pixel region 30, the peripheral region 40, and the pad region 60 on the second insulating interlayer 195, and may have a third opening 503 exposing the upper surface of the second organic layer 113 that is positioned in the bending region 50 (see, e.g., FIG. 4). A width of the third opening 503 along the direction parallel to the upper surface of the substrate 110 may be less than a width of the second opening 502 along the direction parallel to the upper surface of the substrate 110, and may be greater than a width of the first opening 501 along the direction parallel to the upper surface of the substrate 110. The third opening 503 may overlap the first and second openings 501 and 502 along the direction orthogonal to the upper surface of the substrate 110. In addition, the passivation layer 180 may include a first contact hole 181 that is positioned in the peripheral region 40 and a second contact hole 182 that is positioned in the pad region 60. The passivation layer 180 may include a silicon compound, or a metal oxide.

The first planarization layer 270 may be disposed on the passivation layer 180. The first planarization layer 270 may be disposed on upper and side surfaces of the passivation layer 180 in the pixel region 30, and may be positioned in the first opening 501, the second opening 502, the third opening 503, and the fourth opening 504 such that the first planarization layer 270 does not overlap the first and second contact holes of the passivation layer 180 in the peripheral region 40, the bending region 50, and the pad region 60 along the direction orthogonal to the upper surface of the substrate 110. As an example, the first planarization layer 270 may be positioned under the connection electrode 330 (or between the connection electrode 330 and the substrate 110) in a portion of the peripheral region 40, the bending region 50, and a portion of the pad region 60 on the substrate 110. In an exemplary embodiment of the present invention, the first planarization layer 270 may be in direct contact with the upper surface of the second organic layer 113 in the bending region 50. For example, the first planarization layer 270 may be relatively thick along the direction orthogonal to the upper surface of the substrate 110. As an example, the first planarization layer 270 may have a substantially flat upper surface, and a planarization process may be further performed on the first planarization layer 270 to implement the flat upper surface of the first planarization layer 270. Alternatively, the first planarization layer 270 may be disposed as a substantially uniform thickness along a profile of the passivation layer 180. Thus, a step may be formed above the passivation layer 180. The first planarization layer 270 may include organic materials or inorganic materials. In an exemplary embodiment of the present invention, the first planarization layer 270 may include organic materials.

The wiring pattern 215 and the connection pattern 235 may be positioned in the pixel region 30 on the first planarization layer 270. Scan signals, data signals, light emission signals, initialization signals, power supply voltage, etc may be transferred through the wiring pattern 215. The connection pattern 235 may be in contact with the drain electrode 230 via a contact hole formed by removing a portion of the first planarization layer 270 that is positioned in the pixel region 30, and may be electrically connected to the lower electrode 290 and the drain electrode 230. Each of the wiring pattern 215 and the connection pattern 235 may include a metal, an alloy of a metal, a metal nitride, a conductive metal oxide, or transparent conductive materials. These may be used alone or in a desired combination thereof. In an exemplary embodiment of the present invention, each of the wiring pattern 215 and the connection pattern 235 may have a multi-layered structure.

The connection electrode 330 may be positioned in a portion of the peripheral region 40, the bending region 50, and a portion of the pad region 60 on the passivation layer 180 and the first planarization layer 270. The connection electrode 330 may be in direct contact with the fan-out wiring 300. For example, the connection electrode 330 may be in direct contact with the first fan-out wiring 301 via the first contact hole in the peripheral region 40, and may be in direct contact with the second fan-out wiring 302 via the second contact hole in the pad region 60. As the connection electrode 330 is electrically connected to the first fan-out wiring 301 and the second fan-out wiring 302, scan signals, data signals, light emission signals, initialization signals, or a power supply voltage that are applied from the external device 101 may be provided to the pixel structure 400. In an exemplary embodiment of the present invention, the connection electrode 330, the wiring pattern 215, and the connection pattern 235 may be substantially simultaneously formed using a same material. The connection electrode 330 may include a metal, an alloy of a metal, a metal nitride, a conductive metal oxide, or transparent conductive material. These may be used alone or in a desired combination thereof. In an exemplary embodiment of the present invention, the connection electrode 330 may have a multi-layered structure.

The second planarization layer 275 may be disposed on the wiring pattern 215, the connection pattern 235, the connection electrode 330, the first planarization layer 270, and the passivation layer 180. The second planarization layer 275 may be disposed on upper and side surfaces of the wiring pattern 215 and the connection pattern 235 in the pixel region 30 on the first planarization layer 270 and extend in the first direction D1, and may be disposed on upper and side surfaces of the connection electrode 330 in a portion of the peripheral region 40, the bending region 50, and a portion of the pad region 60. As an example, the second planarization layer 275 may be positioned on the entire substrate 110.

According to an exemplary embodiment of the present invention, the OLED device 100 may include a block region extending along the second direction D2 in a portion of the peripheral region 40 that is positioned between the pixel region 30 and the bending region 50 (see, e.g., FIG. 1A). The block region may be arranged in parallel with the bending region 50, and the first planarization layer 270 and the second planarization layer 275 need not be positioned in the block region. For example, the first planarization layer 270 and the second planarization layer 275 need not be disposed in the block region so as to block water or moisture permeated into the pixel region 30 through the first planarization layer 270 and the second planarization layer 275 that are positioned in the pad region 60 and/or the bending region 50.

The second planarization layer 275 may be relatively thick along the direction orthogonal to the upper surface of the substrate 110 to cover the wiring pattern 215, the connection pattern 235, and the connection electrode 330. As an example, the second planarization layer 275 may have a substantially flat upper surface, and a planarization process may be further performed on the second planarization layer 275 to implement the flat upper surface of the second planarization layer 275. Alternatively, the second planarization layer 275 may be disposed as a substantially uniform thickness along a profile of the wiring pattern 215, the connection pattern 235, and the connection electrode 330. Thus, a step may be formed above wiring pattern 215. The second planarization layer 275 may include organic materials or inorganic materials. In an exemplary embodiment of the present invention, the second planarization layer 275 may include organic materials.

The lower electrode 290 may be positioned in the pixel region 30 on the second planarization layer 275. The lower electrode 290 may be in contact with the drain electrode 230 via a contact hole formed by removing a portion of the second planarization layer 275. In addition, the lower electrode 290 may be electrically connected to the semiconductor element 250. The lower electrode 290 may include a metal, a metal alloy, a metal nitride, a conductive metal oxide, or transparent conductive materials. These may be used alone or in a desired combination thereof. In an exemplary embodiment of the present invention, the lower electrode 290 may have a multi-layered structure.

The pixel defining layer 310 may be positioned in the pixel region 30 on the second planarization layer 275, and may expose a portion of the lower electrode 290. As an example, the light emitting layer 335 may be disposed on the portion of the lower electrode 290 exposed by the pixel defining layer 310. The pixel defining layer 310 may include organic materials or inorganic materials. In an exemplary embodiment of the present invention, the pixel defining layer 310 may include organic materials.

The light emitting layer 335 may be disposed on the portion of the lower electrode 290 exposed by the pixel defining layer 310. The light emitting layer 335 may be formed using at least one of light emitting materials capable of generating different colors of light (e.g., a red color light, a blue color light, or a green color light) according to sub-pixels. Alternatively, the light emitting layer 335 may generally generate a white color light by stacking a plurality of light emitting materials capable of generating different colors of light such as a red color light, a green color light, or a blue color light. As an example, a color filter may be disposed on the light emitting layer 335. The color filter may include at least one selected from a red color filter, a green color filter, or a blue color filter. Alternatively, the color filter may include a yellow color filter, a cyan color filter, or a magenta color filter. The color filter may include a photosensitive resin (or color photoresist).

The upper electrode 340 may be positioned in the pixel region 30 on the pixel defining layer 310 and the light emitting layer 335. The upper electrode 340 may include a metal, a metal alloy, a metal nitride, a conductive metal oxide, or transparent conductive materials. These may be used alone or in a desired combination thereof. In an exemplary embodiment of the present invention, the upper electrode 340 may have a multi-layered structure. Accordingly, the pixel structure 400 including the lower electrode 290, the light emitting layer 335, and the upper electrode 340 may be positioned in the pixel region 30.

The TFE structure 450 may be disposed on the upper electrode 340. The TFE structure 450 may include the first TFE layer 451, the second TFE layer 452, and the third TFE layer 453. For example, the second TFE layer 452 may be disposed on the first TFE layer 451, and the third TFE layer 453 may be disposed on the second TFE layer 452.

The first TFE layer 451 may be positioned in the pixel region 30 on the upper electrode 340. The first TFE layer 451 may be disposed on upper and side surfaces of the upper electrode 340, and may have a substantially uniform thickness along a profile of the upper electrode 340. The first TFE layer 451 may prevent the pixel structure 400 from being deteriorated by the permeation of moisture, water, or oxygen. In addition, the first TFE layer 451 may protect the pixel structure 400 from external impacts. The first TFE layer 451 may include inorganic materials.

The second TFE layer 452 may be disposed on the first TFE layer 451. The second TFE layer 452 may increase the flatness of the OLED device 100, and may protect the pixel structure 400. The second TFE layer 452 may include organic materials.

The third TFE layer 453 may be disposed on the second TFE layer 452. The third TFE layer 453 may cover the second TFE layer 452, and may have a substantially uniform thickness along a profile of the second TFE layer 452. The third TFE layer 453 together with the first TFE layer 451 and the second TFE layer 452 may prevent the pixel structure 400 from being deteriorated by the permeation of moisture, water, or oxygen. In addition, the third TFE layer 453 together with the first TFE layer 451 and the second TFE layer 452 may protect the pixel structure 400 from external impacts. The third TFE layer 453 may include inorganic materials. Accordingly, the TFE structure 450 including the first TFE layer 451, the second TFE layer 452, and the third TFE layer 453 may be positioned in the pixel region 30.

Alternatively, the TFE structure 450 may have five layers structure where first to fifth TFE layers are stacked or seven layers structure where the first to seventh TFE layers are stacked.

In an exemplary embodiment of the present invention, the OLED device 100 may further include a lower protection film and a bending protection layer. The lower protection film may be disposed on a lower surface of the substrate 110. The lower protection film may protect the pixel structure 400 and the semiconductor element 250. The lower protection film may be entirely positioned in the pixel region 30, the peripheral region 40, and the pad region 60, and may expose a lower surface of the substrate 110 that is located in the bending region 50. The lower protection film may include polyethylene terephthalate (PET), polyethylene naphthalate (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), or modified polyphenylene oxide (MPPO).

The bending protection layer may be positioned in a portion of the peripheral region 40, the bending region 50, and a portion of the pad electrode region 60 on the second planarization layer 275. The bending protection layer may protect the connection electrode 330, and may raise a neutral plane of the bending region 50 in the third direction D3 that is orthogonal to the first and second directions D1 and D2. For example, when the bending region 50 is bent, the connection electrodes might not be broken because the neutral plane of the bending region 50 is positioned within a portion where the connection electrodes are disposed. The bending protection layer 460 may include organic materials such as polyimide, an epoxy-based resin, an acryl-based resin, a polyester, a photoresist, an polyacryl-based resin, a polyimide-based resin, a polyamide-based resin, or a siloxane-based resin, and may include elastic materials such as silicon, urethane, or thermoplastic poly urethane (TPU).

In a process for manufacturing the OLED device 100, a preliminary insulation layer structure may be formed on the entire substrate 110. A first etching process (e.g., a first dry etching process) may be performed prior to a process for forming the source electrode 210 and the drain electrode 230 on the preliminary insulation layer structure. The source and drain regions of the active layer 130 in the pixel region 30 may be exposed through the first etching process. In addition, the preliminary insulation layer structure and a portion of the buffer layer 115 (e.g., a portion of the second inorganic layer 118 included in the buffer layer 115) may be removed in a portion of the peripheral region 40, the bending region 50, and a portion of the pad region 60 through the first etching process. Accordingly, the insulation layer structure 200 may be formed.

After the first etching process, a preliminary electrode layer may be formed above the entire substrate 110. After the preliminary electrode layer is formed, a second etching process (e.g., a second dry etching process) may be performed. The source electrode 210 and the drain electrode 230 may be formed in the pixel region 30 through the second etching process. In addition, the fan-out wiring 300 may be formed in the peripheral region 40 and the pad region 60 through the second etching process. Further, a remaining portion of the second inorganic layer 118 included in the buffer layer 115 may be removed in a portion of the peripheral region 40, the bending region 50, a portion of the pad region 60 through the second etching process.

After the second etching process, a preliminary passivation layer may be formed above entire the substrate 110. After the preliminary passivation layer is formed, a third etching process (e.g., a third dry etching process) may be performed. A contact hole exposing the drain electrode 230 in the pixel region 30 may be formed through the third etching process. In addition, first and second contact holes may be formed in the peripheral region 40 and the pad region 60 through the third etching process. Accordingly, the passivation layer 180 may be formed. Further, the first inorganic layer 117 of the buffer layer 115 and the second barrier layer 114 of the substrate 110 may be removed in the bending region 50 through the third etching process. As an example, the inorganic insulation layers may be removed in the bending region 50 through the third etching process, and an upper surface the second organic layer 113 included in the substrate 110 may be exposed. Accordingly, although an additional etching process is not preformed to remove the inorganic insulation layers that are located in the bending region 50, the inorganic insulation layers that are positioned in the bending region 50 may be removed through the first, second, and third etching processes.

As the OLED device 100 according to an exemplary embodiment of the present invention removes the inorganic insulation layers located in the bending region 50 through the first, second, and third etching processes, a manufacturing cost of the OLED device 100 may be reduced. In addition, since the insulation layer structure 200 is omitted in the peripheral region 40 and the pad region 60 that are positioned adjacent to the bending region 50, the bending region 50 of the OLED device 100 may be readily bent, and the OLED device 100 may serve as a flexible OLED device having a shape where the bending region 50 is bent.

Figure 8:
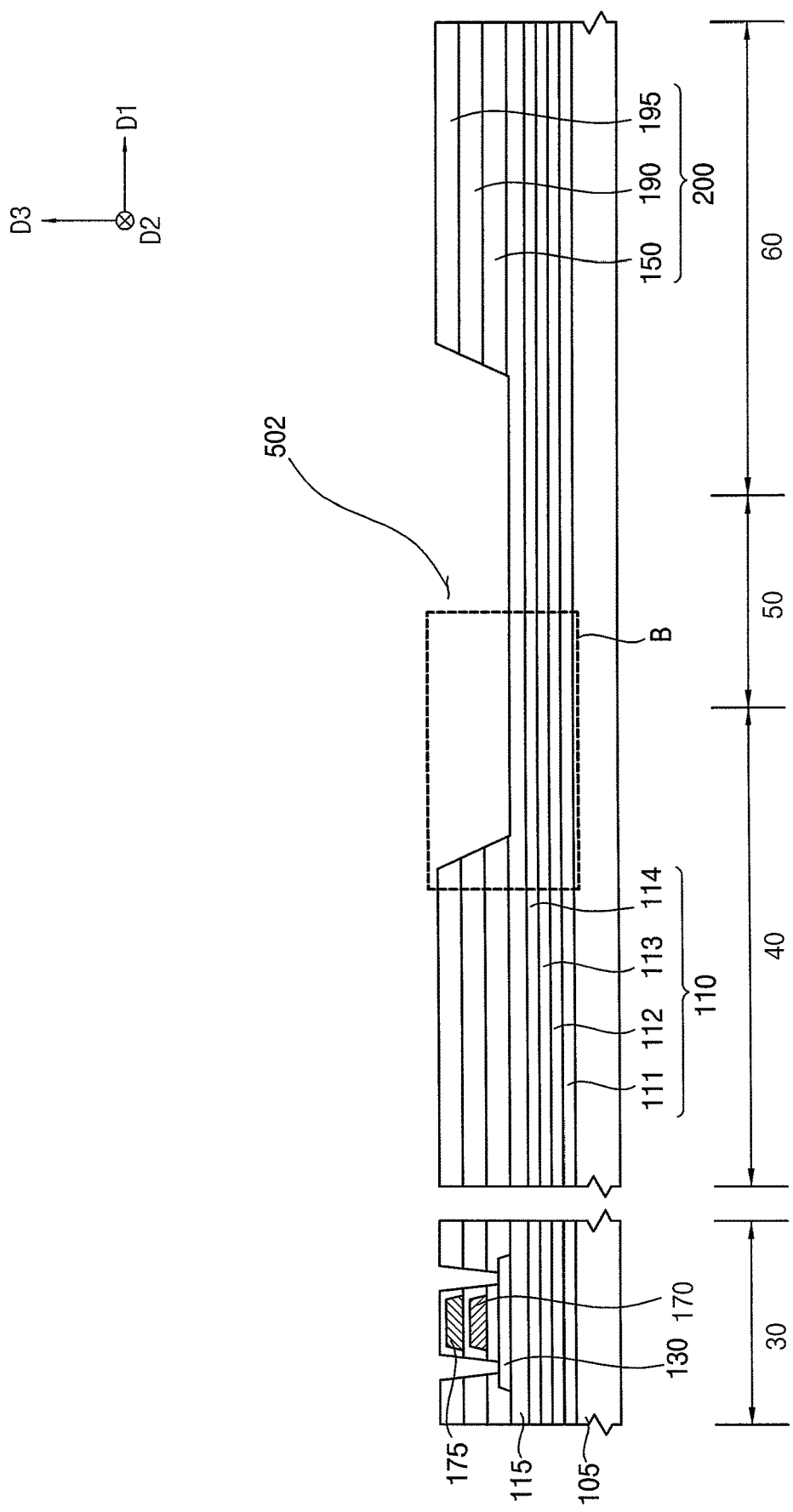
Figure 9:
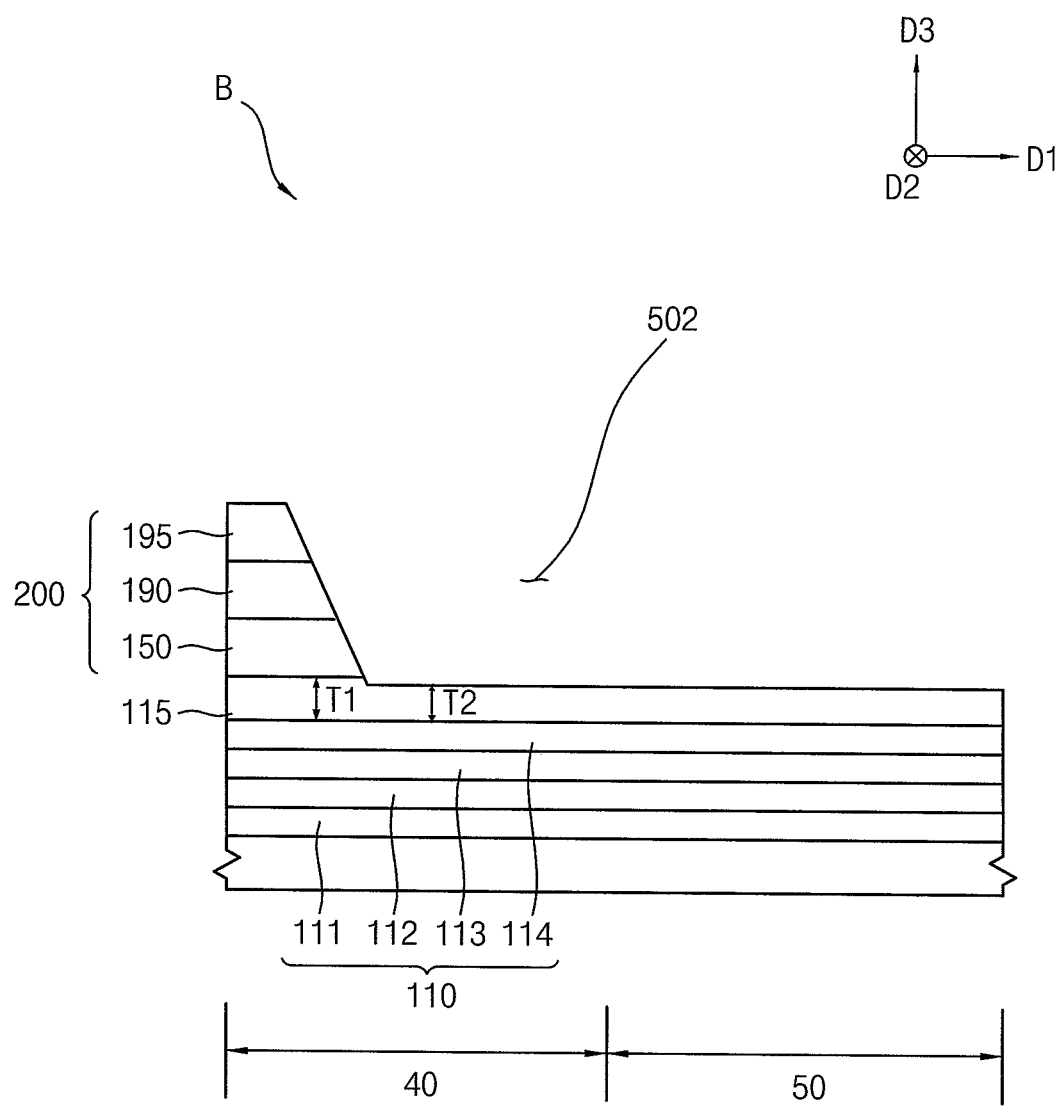
Figure 13:
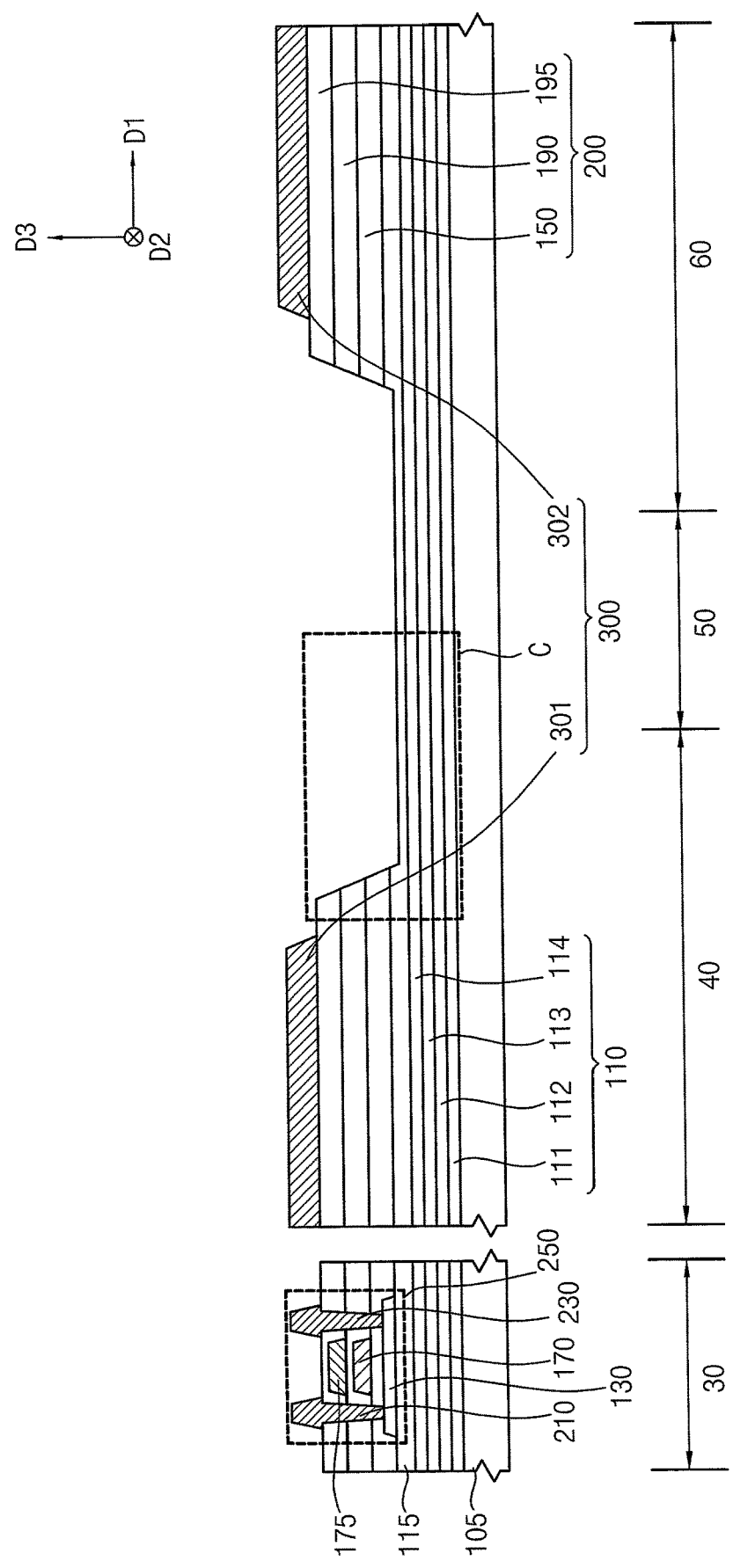
Figure 14:
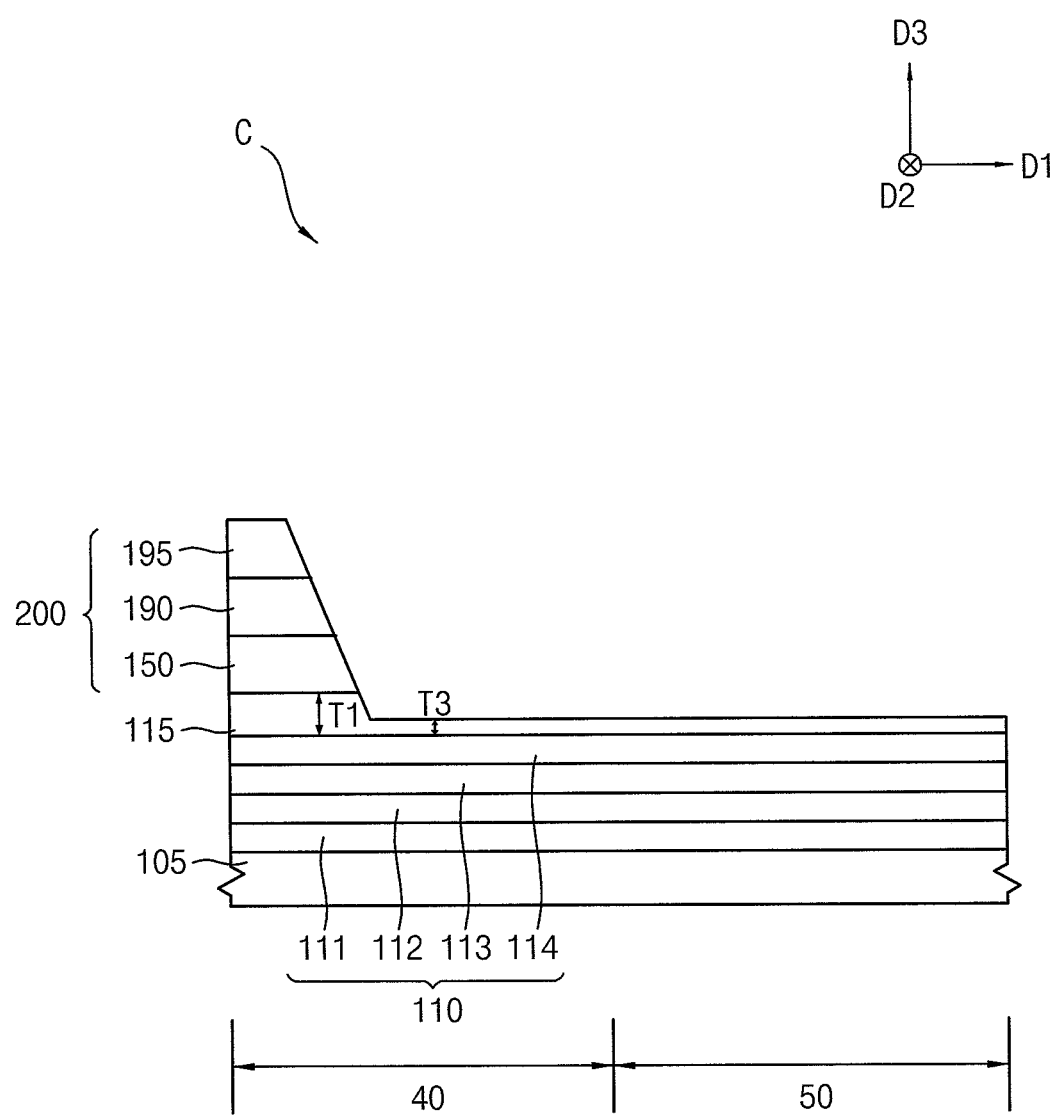
Figure 18:
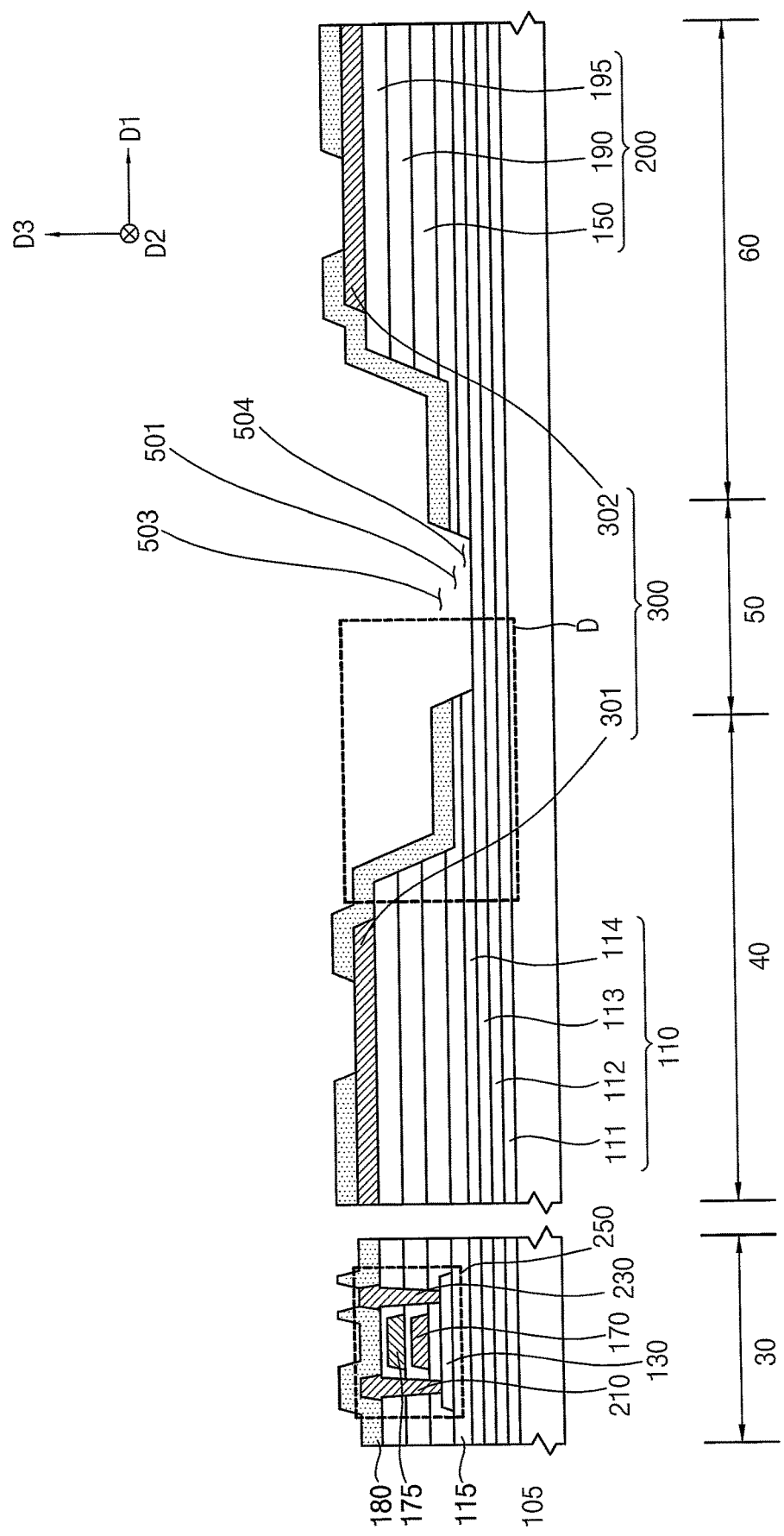
Figure 19:
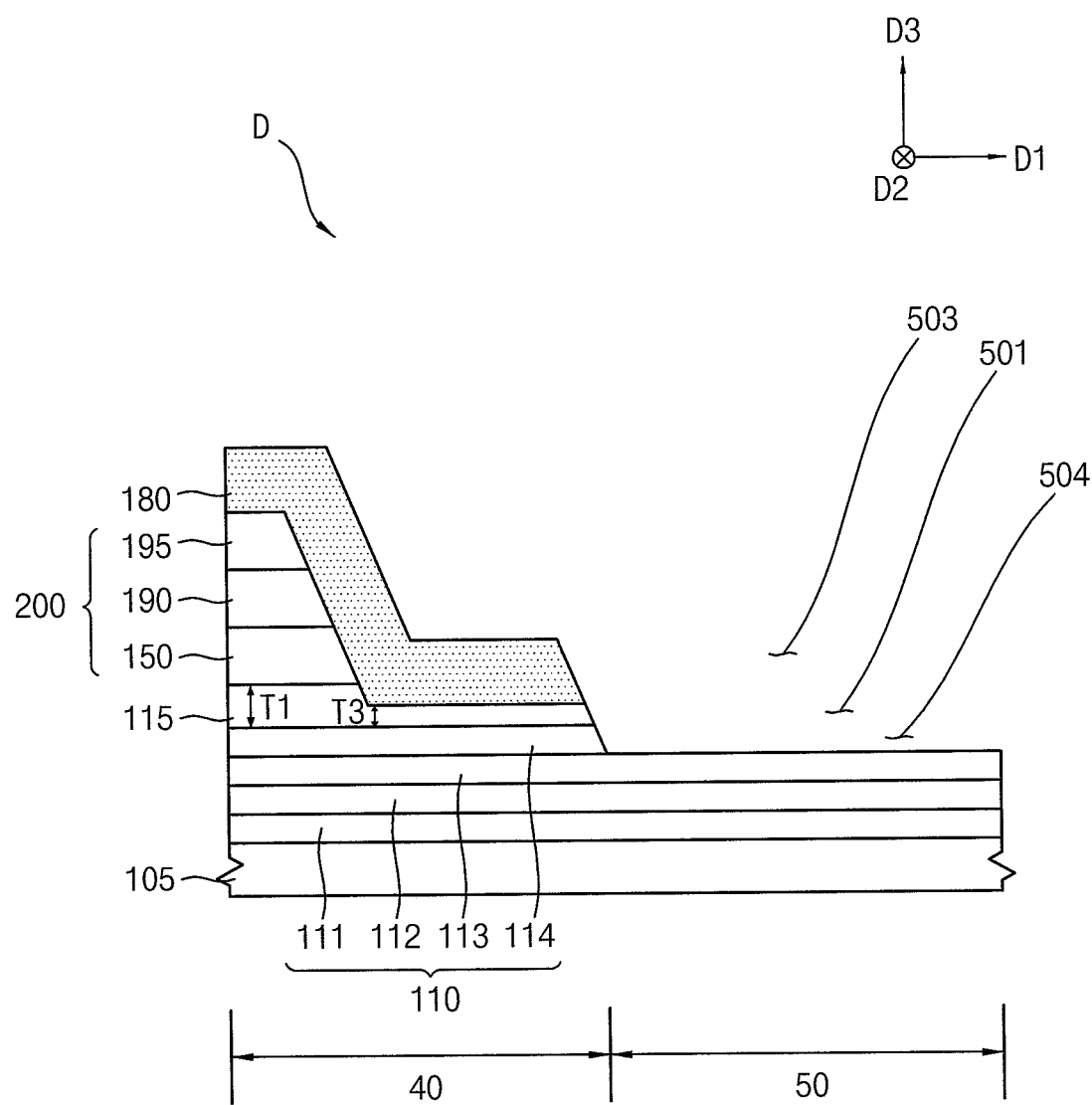
Figure 20:
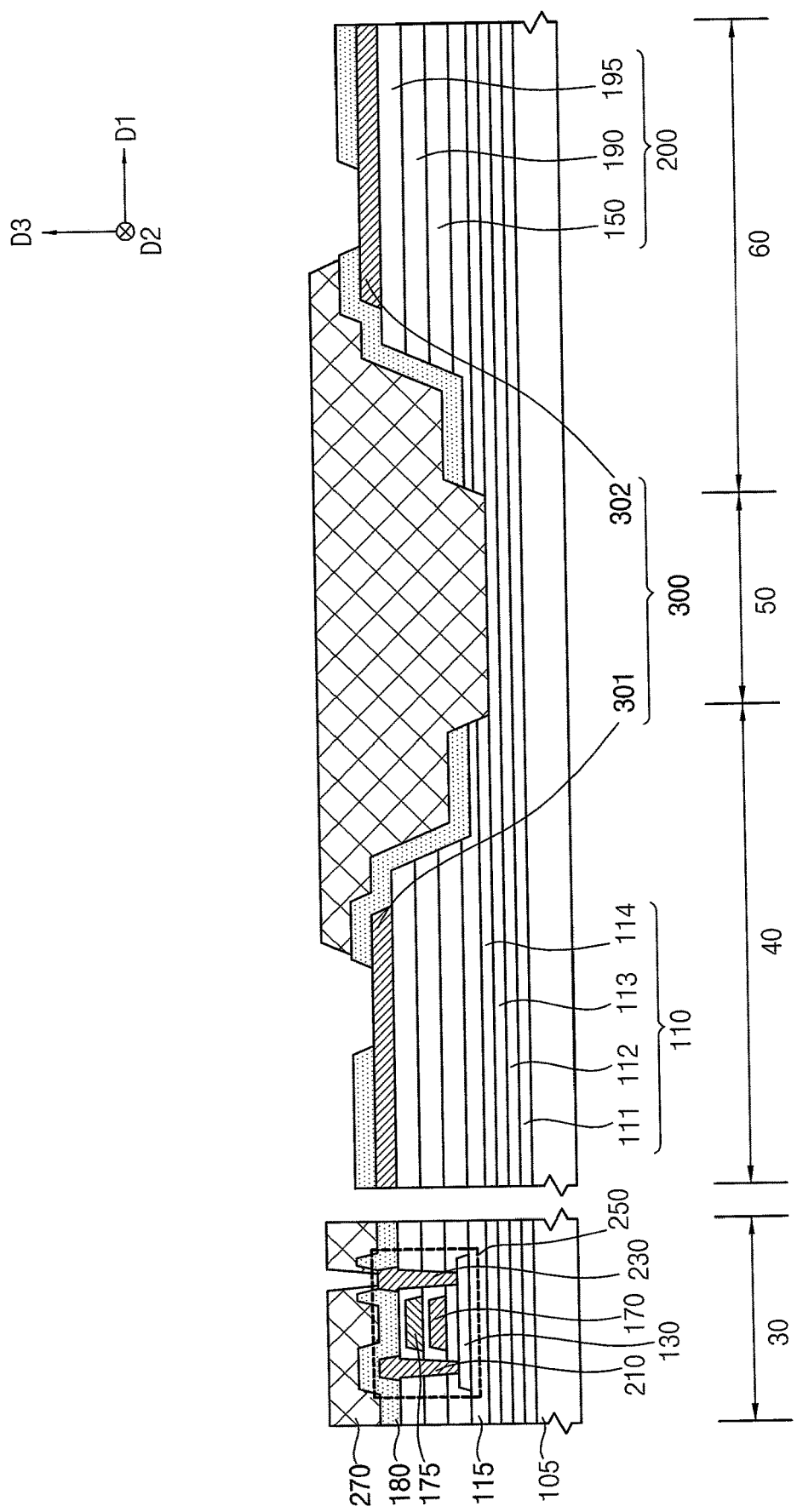

FIGS. 6, 7, 8, 9, 10, 11, 12, 13, 14, 15, 16, 17, 18, 19, 20, 21, 22, and 23 are cross-sectional views illustrating a method of manufacturing an OLED device according to an exemplary embodiment of the present invention. For example, FIG. 9 is an enlarged cross-sectional view corresponding to region 'B' of FIG. 8, and FIG. 10 is a cross-sectional view illustrating a buffer layer of FIG. 9. FIG. 14 is an enlarged cross-sectional view corresponding to region 'C' of FIG. 13, and FIG. 15 is a cross-sectional view illustrating a buffer layer of FIG. 14. Further, FIG. 19 is an enlarged cross-sectional view corresponding to region 'D' of FIG. 18, and FIG. 20 is a cross-sectional view illustrating a buffer layer of FIG. 19.

Figure 6:
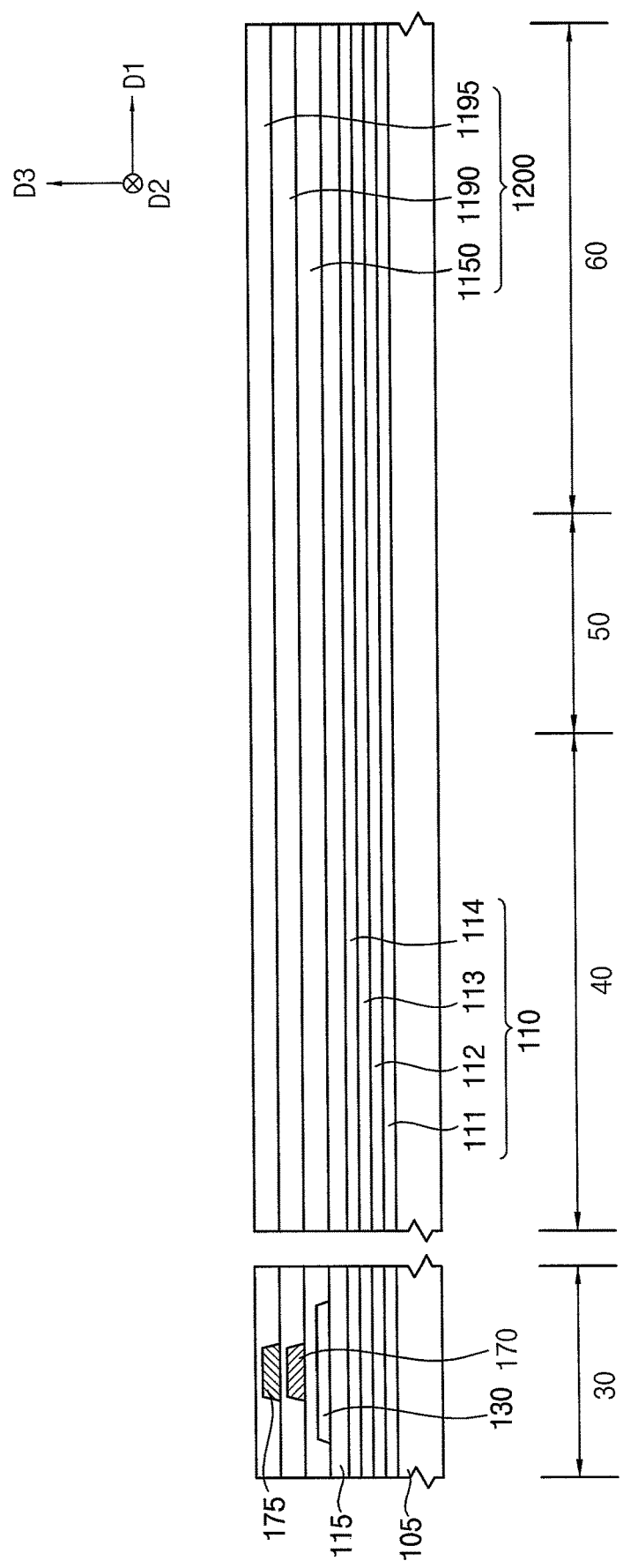

Referring to FIG. 6, a rigid glass substrate 105 may be provided. The substrate 110 including transparent or opaque insulation materials may be formed on the glass substrate 105. The substrate 110 may be formed using a flexible transparent material such as a flexible transparent resin substrate. In an exemplary embodiment of the present invention, the substrate 110 may have configuration in which the first organic layer 111, the first barrier layer 112, the second organic layer 113, and the second barrier layer 114 are sequentially stacked. The first barrier layer 112 and the second barrier layer 114 each may be formed using inorganic materials such as silicon compound, or metal oxide. For example, the first barrier layer 112 and the second barrier layer 114 each may include SiOx, SiNx, SiOxNy, SiOxCy, SiCxNy, AlOx, AlNx, TaOx, HfOx, ZrOx, or TiOx. As an example, the first organic layer 111 and the second organic layer 113 each may be formed using organic materials such as a photoresist, a polyacryl-based resin, a polyimide-based resin, a polyamide-based resin, a siloxane-based resin, an acryl-based resin, or an epoxy-based resin. In an exemplary embodiment of the present invention, each of the first and second barrier layers 112 and 114 may be formed of silicon oxide, and may block moisture or water that is permeated through the first and second organic layers 111 and 113. Further, each of the first and second organic layers 111 and 113 may be formed of a polyimide-based resin. The polyimide-based resin may be a random copolymer or a block copolymer. The polyimide-based resin may have a relatively high transparency, a relatively low coefficient of thermal expansion, and a relatively high glass transition temperature. Since the polyimide-based resin includes imide, the polyimide-based resin may have relatively high heat resistance, relatively high chemical resistance, relatively high abrasion resistance, and relatively high electrical conduction characteristics.

The buffer layer 115 may be formed on the substrate 110. In an exemplary embodiment of the present invention, the buffer layer 115 may be entirely formed in the pixel region 30, the peripheral region 40, the bending region 50, and the pad region 60 on the substrate 110. The buffer layer 115 may include the first inorganic layer 117 and the second inorganic layer 118 that is formed on the first inorganic layer 117. A thickness of the first inorganic layer 117 may be about 500 angstroms, and a thickness of the second inorganic layer 118 may be about 2000 angstroms. The buffer layer 115 may prevent the diffusion of metal atoms and/or impurities from the substrate 110 into a semiconductor element. In addition, the buffer layer 115 may control a rate of a heat transfer in a crystallization process for forming an active layer, thereby obtaining substantially uniform active layer. Further, the buffer layer 115 may increase a surface flatness of the substrate 110 when a surface of the substrate 110 is relatively irregular. The buffer layer 115 may be formed using silicon compound, or metal oxide. In an exemplary embodiment of the present invention, the first inorganic layer 117 of the buffer layer 115 may be formed of silicon nitride, and the second inorganic layer 118 of the buffer layer 115 may be formed of silicon oxide.

The active layer 130 may be positioned in the pixel region 30 on the buffer layer 115. The active layer 130 may be formed using an oxide semiconductor, an inorganic semiconductor (e.g., amorphous silicon, polysilicon, etc.), or an organic semiconductor.

A preliminary gate insulation layer 1150 may be formed on the active layer 130. The preliminary gate insulation layer 1150 may be disposed on upper and side surfaces of the active layer 130 in the pixel region 30 on the buffer layer 115, and may extend in the first direction D1 from the pixel region 30 into the pad region 60. As an example, the preliminary gate insulation layer 1150 may be formed on substantially the entire buffer layer 115. For example, the preliminary gate insulation layer 1150 may cover the active layer 130 on the buffer layer 115, and may have a substantially level upper surface without a step around the active layer 130. Alternatively, the preliminary gate insulation layer 1150 may cover the active layer 130 on the buffer layer 115, and may be formed as a substantially uniform thickness along a profile of the active layer 130. Thus, a step may be formed above the active layer 130. The preliminary gate insulation layer 1150 may be formed using a silicon compound, or a metal oxide.

The first gate electrode 170 may be formed on a portion of the preliminary gate insulation layer 1150 under which the active layer 130 is positioned. The first gate electrode 170 may be formed using a metal, a metal alloy, a metal nitride, a conductive metal oxide, or transparent conductive materials. These may be used alone or in a desired combination thereof. In an exemplary embodiment of the present invention, the first gate electrode 170 may have a multi-layered structure.

A preliminary first insulating interlayer 1190 may be formed on the first gate electrode 170. The preliminary first insulating interlayer 1190 may be disposed on upper and side surfaces of the first gate electrode 170 in the pixel region 30 on the preliminary gate insulation layer 1150, and may extend in the first direction D1. As an example, the preliminary first insulating interlayer 1190 may be formed on substantially the entire preliminary gate insulation layer 1150. For example, the preliminary first insulating interlayer 1190 may cover the first gate electrode 170 on the preliminary gate insulation layer 1150, and may have a substantially level surface without a step around the first gate electrode 170. Alternatively, the preliminary first insulating interlayer 1190 may cover the first gate electrode 170 on the preliminary gate insulation layer 1150, and may be disposed as a substantially uniform thickness along a profile of the first gate electrode 170. Thus, a step may be formed above the first gate electrode 170. In an exemplary embodiment of the present invention, the preliminary first insulating interlayer 1190 may be formed using a silicon compound, or a metal oxide.

The second gate electrode 175 may be formed on a portion of the preliminary first insulating interlayer 1190 under which the first gate electrode 170 is positioned. The second gate electrode 175 may be formed using a metal, a metal alloy, a metal nitride, a conductive metal oxide, or transparent conductive materials. These may be used alone or in a desired combination thereof. In an exemplary embodiment of the present invention, the second gate electrode 175 may have a multi-layered structure.

A preliminary second insulating interlayer 1195 may be formed on the second gate electrode 175. The preliminary second insulating interlayer 1195 may be disposed on upper and side surfaces of the second gate electrode 175 in the pixel region 30 on the preliminary first insulating interlayer 1190, and may extend in the first direction D1. As an example, the preliminary second insulating interlayer 1195 may be formed on substantially the entire preliminary first insulating interlayer 1190. For example, the preliminary second insulating interlayer 1195 may cover the second gate electrode 175 on the preliminary first insulating interlayer 1190, and may have a substantially level surface without a step around the second gate electrode 175. Alternatively, the preliminary second insulating interlayer 1195 may cover the second gate electrode 175 on the first preliminary insulating interlayer 1190, and may be disposed as a substantially uniform thickness along a profile of the second gate electrode 175. Thus, a step may be formed above the second gate electrode 175. In an exemplary embodiment of the present invention, the preliminary second insulating interlayer 1195 may be formed using a silicon compound, or a metal oxide. Accordingly, a preliminary insulation layer structure 1200 including the preliminary gate insulation layer 1150, the preliminary first insulating interlayer 1190, and the preliminary second insulating interlayer 1195 may be formed.

Figure 7:
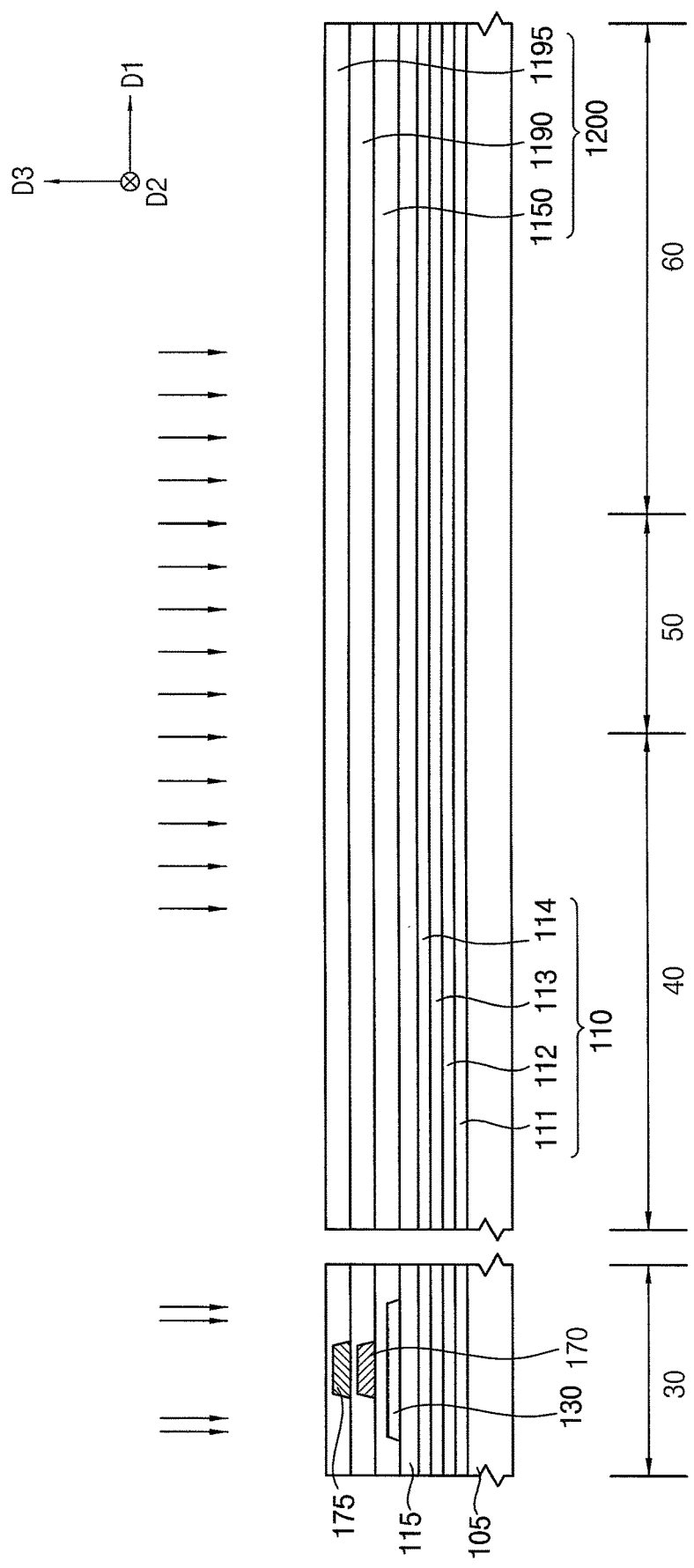

Referring to FIG. 7, a first dry etching process (e.g., a first etching process) may be selectively performed on the preliminary insulation layer structure 1200. For example, the first dry etching process may be performed using a gas mixed with fluorocarbon and/or oxygen. Alternatively, a first wet etching process using an etchant may be performed instead of the first dry etching process.

Referring to FIGS. 8, 9, and 10, source and drain regions of the active layer 130 in the pixel region 30 may be exposed through the first dry etching process. In addition, an insulation layer structure 200 may be formed by removing a portion of the preliminary insulation layer structure 1200 in a portion of the peripheral region 40 that is positioned adjacent to the bending region 50, the bending region 50, and a portion of the pad region 60 that is located adjacent to the bending region 50 through the first dry etching process. Further, a portion of the buffer layer 115 (e.g., a portion of the second inorganic layer 118 included in the buffer layer 115) may be removed through the first dry etching process. As an example, a portion of the second inorganic layer 118 included in the buffer layer 115 may be overetched in a portion of the peripheral region 40, the bending region 50, and a portion of the pad region 60 while the first dry etching process is performed. For example, about half of the second inorganic layer 118 (e.g., about 1000 angstroms) may be removed in a portion of the peripheral region 40, the bending region 50, and a portion of the pad region 60 through the first dry etching process (see, e.g., FIG. 10).

As an example, the second opening 502 exposing an upper surface of the buffer layer 115 that is positioned in a portion of the peripheral region 40, the bending region 50, and a portion of the pad region 60 may be formed in the insulation layer structure 200 through the first dry etching process. In addition, referring to FIGS. 9 and 10, a portion of the second inorganic layer 118 included in the buffer layer 115 may be removed through the first dry etching process, such that the buffer layer 115 may have the first thickness T1 and the second thickness T2. For example, the buffer layer 115 may have a first portion and a second portion. The first portion may correspond to a portion where a portion of the second inorganic layer 118 included in the buffer layer 115 is removed through the first dry etching process, and may have the second thickness T2 (e.g., about 1500 angstroms). In addition, the second portion may be positioned to overlap the insulation layer structure 200 along the direction orthogonal to the upper surface of the substrate 110, and may have the first thickness T1 (e.g., about 2500 angstroms). For example, the first thickness T1 may be greater than the second thickness T2 along the direction orthogonal to the upper surface of the substrate 110.

Figure 11:
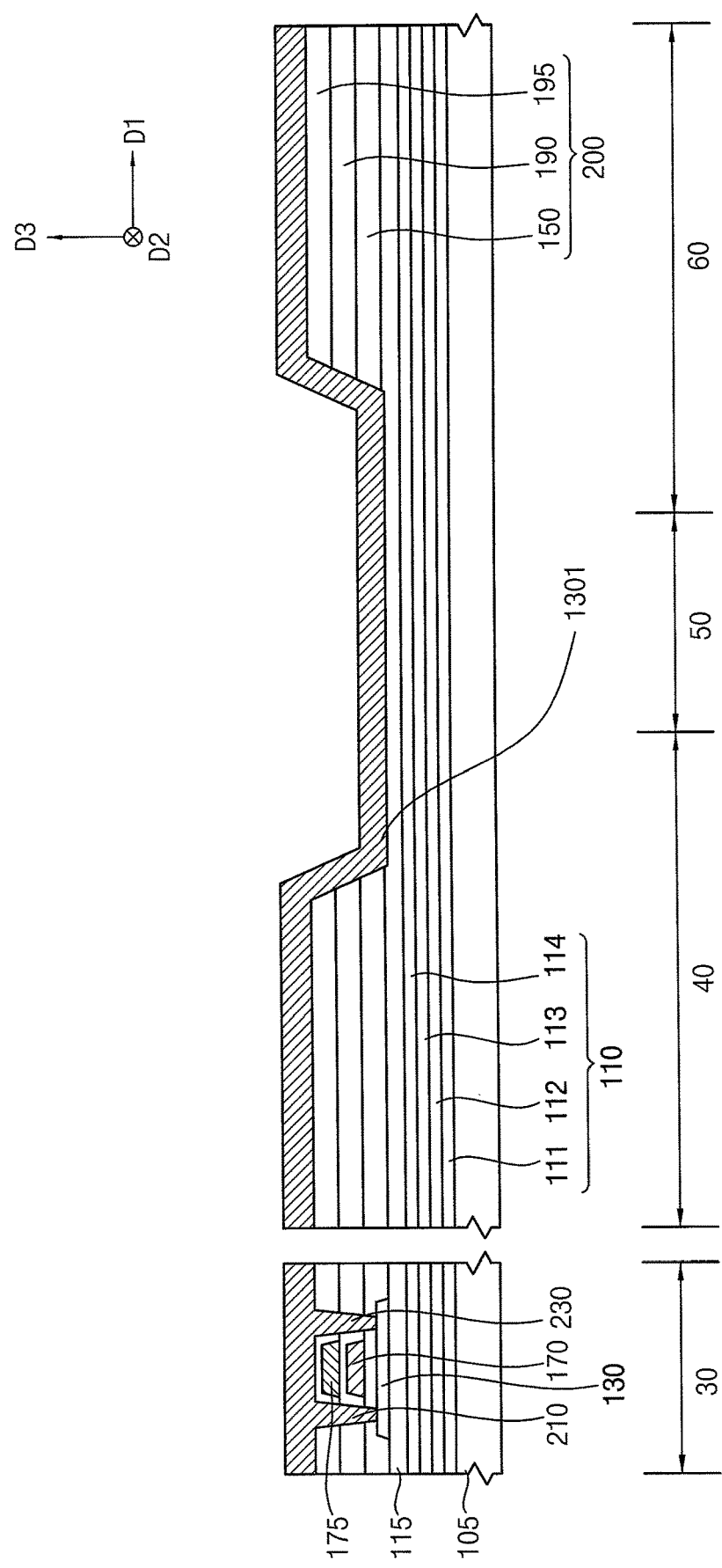
Figure 12:
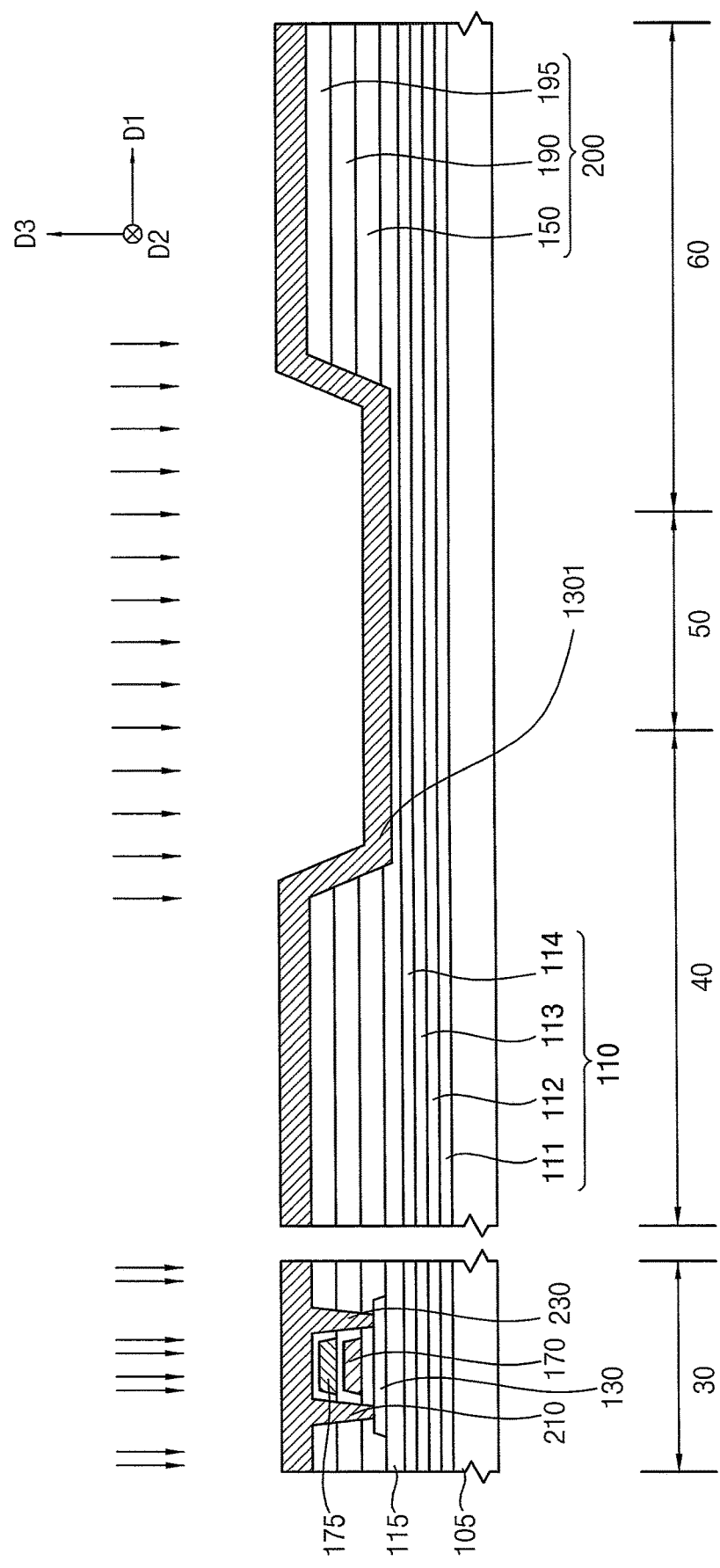

Referring to FIGS. 11 and 12, after the first dry etching process, a preliminary electrode layer 1301 may be formed on the entire substrate 110. After the preliminary electrode layer 1301 is formed, a second dry etching process (e.g., a second etching process) may be selectively performed in the preliminary electrode layer 1301 (see, e.g., FIG. 12). For example, the second dry etching process may be performed using a gas mixed with fluorocarbon and/or oxygen. Alternatively, a second wet etching process using an etchant may be performed instead of the second dry etching process.

Referring to FIGS. 13, 14, and 15, the source electrode 210 and the drain electrode 230 may be formed in the pixel region 30 through the second dry etching process. In addition, the fan-out wiring 300 may be formed in the peripheral region 40 and the pad region 60 through the second dry etching process. The fan-out wiring 300 may include the first fan-out wiring 301 and the second fan-out wiring 302. A remaining portion of the second inorganic layer 118 included in the buffer layer 115 may be removed in a portion of the peripheral region 40, the bending region 50, a portion of the pad region 60 through the second dry etching process. As an example, the remaining portion of the second inorganic layer 118 included in the buffer layer 115 may be overetched in a portion of the peripheral region 40, the bending region 50, and a portion of the pad region 60 while the second dry etching process is performed. For example, the remaining portion of the second inorganic layer 118 (e.g., about 1000 angstroms) may be removed in a portion of the peripheral region 40, the bending region 50, and a portion of the pad region 60 (e.g., the second inorganic layer 118 may be completely removed in a portion of the peripheral region 40, the bending region 50, and a portion of the pad region 60) through the second dry etching process (see, e.g., FIG. 15).

As an example, the first fan-out wiring 301 may be formed in the peripheral region 40 on the insulation layer structure 200 through the second dry etching process, and the second fan-out wiring 302 may be formed in the pad region 60 on the insulation layer structure 200 through the second dry etching process. The first fan-out wiring 301 and the second fan-out wiring 302 need not be formed in an upper surface of the buffer layer 115 that is positioned in a portion of the peripheral region 40, the bending region 50, and a portion of the pad region 60 such that an upper surface of the substrate 110 and a first portion 116 of the buffer layer 115 are exposed.

Referring to FIGS. 14 and 15, a remaining portion of the second inorganic layer 118 included in the buffer layer 115 may be removed in a portion of the peripheral region 40, the bending region 50, a portion of the pad region 60 through the second dry etching process, such that the buffer layer 115 may have the first thickness T1 and a third thickness T3 along the direction orthogonal to the upper surface of the substrate 110. For example, as described above, the buffer layer 115 may include the first portion and the second portion. The first portion may correspond to a portion where a remaining portion of the second inorganic layer 118 included in the buffer layer 115 is removed through the second dry etching process, and may have the third thickness T3 (e.g., about 500 angstroms). In addition, the second portion may be positioned to overlap the insulation layer structure 200 along the direction orthogonal to the upper surface of the substrate 110, and may have the first thickness T1 (e.g., about 2500 angstroms). For example, the first thickness T1 may be greater than the third thickness T3.

Figure 16:
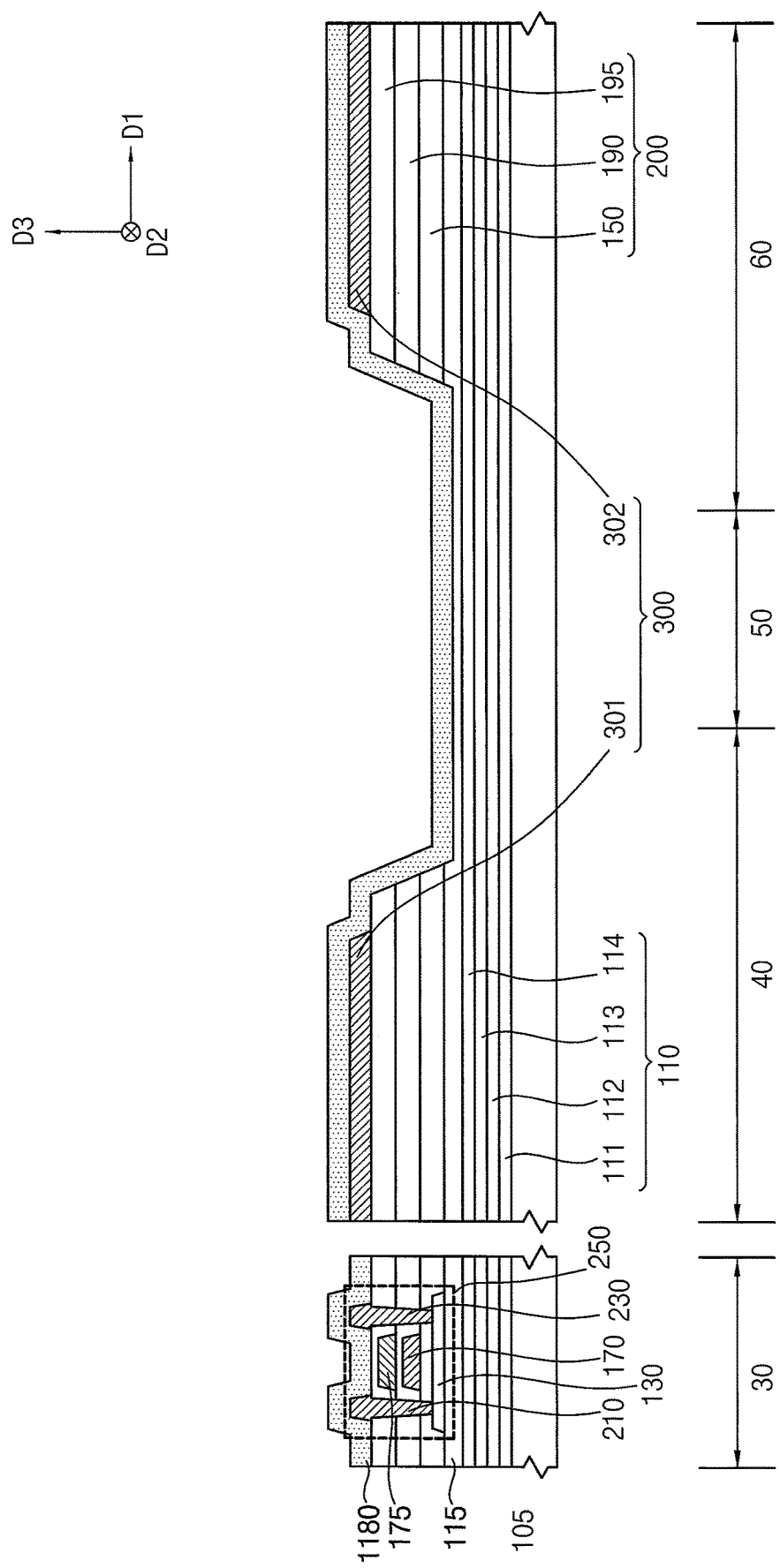
Figure 17:
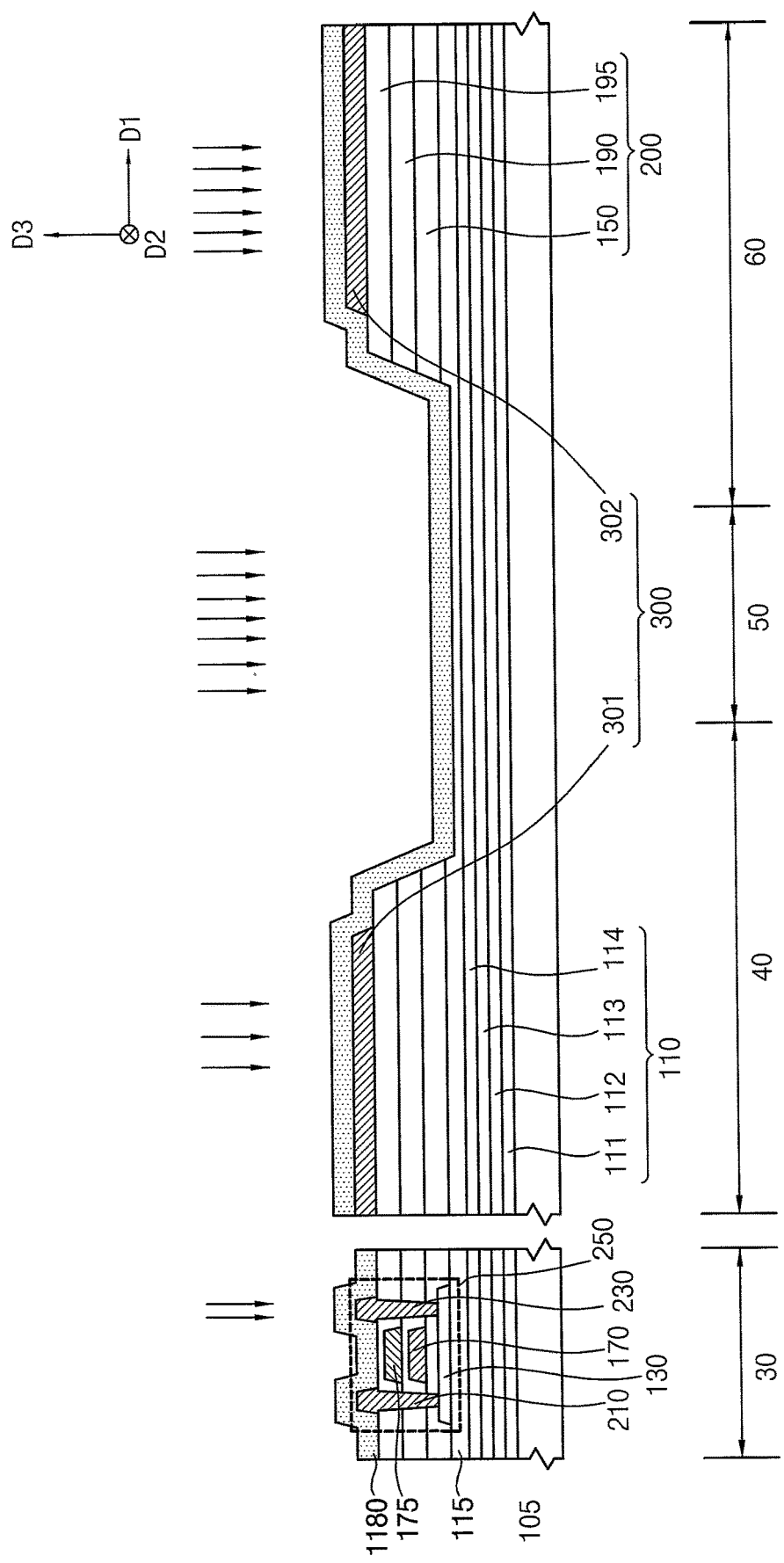

Referring to FIGS. 16 and 17, after the second dry etching process, a preliminary passivation layer 1180 may be formed above the entire the substrate 110. For example, the preliminary passivation layer 1180 may be conformally formed above the substrate. After the preliminary passivation layer 1180 is formed, a third dry etching process (e.g., a third etching process) may be selectively performed in the preliminary passivation layer 1180 (see, e.g., FIG. 17). For example, the third dry etching process may be performed using a gas mixed with fluorocarbon and/or oxygen. In an exemplary embodiment of the present invention, particles that are generated from etching processes may be positioned in side walls of the second opening 502 included in the insulation layer structure 200. As the preliminary passivation layer 1180 is disposed on the side walls of the second opening 502, the preliminary passivation layer 1180 may completely cover the particles. For example, when the particles are not covered, an OLED device may be damaged by the particles. Accordingly, the OLED device may be protected from the particles because the particles are covered.

Referring to FIG. 18, a contact hole exposing the drain electrode 230 in the pixel region 30 may be formed through the third dry etching process. In addition, first and second contact holes may be formed in the peripheral region 40 and the pad region 60 through the third dry etching process. Accordingly, the passivation layer 180 may be formed. Further, the first inorganic layer 117 of the buffer layer 15 and the second barrier layer 114 of the substrate 110 may be removed in the bending region 50 through the third dry etching process. As an example, the first inorganic layer 117 and the second barrier layer 114 may be overetched in a portion of the peripheral region 40, the bending region 50, and a portion of the pad region 60 while the third dry etching process is performed. For example, the first inorganic layer 117 (e.g., about 500 angstroms) and the second barrier layer 114 (e.g., about 1500 angstroms) may be removed in the bending region 50 (e.g., the first inorganic layer 117 and the second barrier layer 114 may be completely removed in the bending region 50) through the third dry etching process (see, e.g., FIG. 15).

As an example, the third opening 503 exposing the bending region 50 may be formed through the third dry etching process, and the third opening 503 may expose an upper surface of the second organic layer 113. In addition, the fourth opening 504 that exposes the upper surface of the second organic layer 113 and is positioned in the bending region 50 may be formed in the second barrier layer 114 through the third dry etching process, and the first opening 501 that exposes the upper surface of the second organic layer 113 and is positioned in the bending region 50 may be formed in the buffer layer 115 through the third dry etching process.

Referring to FIG. 19, the buffer layer 115 that is positioned in the bending region 50 may be removed through the third dry etching process, such that the buffer layer 115 may include a first portion having the third thickness T3 (e.g., about 500 angstroms) and a second portion having the first thickness T1 (e.g., about 2500 angstroms). For example, the first thickness T1 may be greater than the third thickness T3. Here, the first portion may be protruded from the side walls of the insulation layer structure 200 along the direction parallel to the upper surface of the substrate 110, and the second portion of the buffer layer 115 may overlap the insulation layer structure 200 along the direction orthogonal to the upper surface of the substrate 110.

Thus, the inorganic insulation layers may be removed in the bending region 50 through the first, second, and third dry etching processes, and the upper surface the second organic layer 113 included in the substrate 110 may be exposed. Accordingly, although an additional dry etching process is not preformed to remove the inorganic insulation layers that are positioned in the bending region 50, the inorganic insulation layers that are positioned in the bending region 50 may be removed through the first, second, and third dry etching processes. Thus, the number of a masks used for manufacturing the OLED device may be reduced.

Referring to FIG. 20, the first planarization layer 270 may be formed on the passivation layer 180. The first planarization layer 270 may cover the passivation layer 180 in the pixel region 30, and may be formed in the first opening 501, the second opening 502, the third opening 503, and the fourth opening 504 such that the first planarization layer 270 does not overlap the first and second contact holes of the passivation layer 180 in the peripheral region 40, the bending region 50, and the pad region 60 along the direction orthogonal to the upper surface of the substrate 110. In an exemplary embodiment of the present invention, the first planarization layer 270 may be in direct contact with the upper surface of the second organic layer 113 in the bending region 50. For example, the first planarization layer 270 may be relatively thick along the direction orthogonal to the upper surface of the substrate 110. As an example, the first planarization layer 270 may have a substantially flat upper surface, and a planarization process may be further performed on the first planarization layer 270 to implement the flat upper surface of the first planarization layer 270. Alternatively, the first planarization layer 270 may be formed as a substantially uniform thickness along a profile of the passivation layer 180. Thus, a step may be formed above the passivation layer 180. The first planarization layer 270 may include organic materials or inorganic materials. In an exemplary embodiment of the present invention, the first planarization layer 270 may be formed using organic materials.

Figure 21:
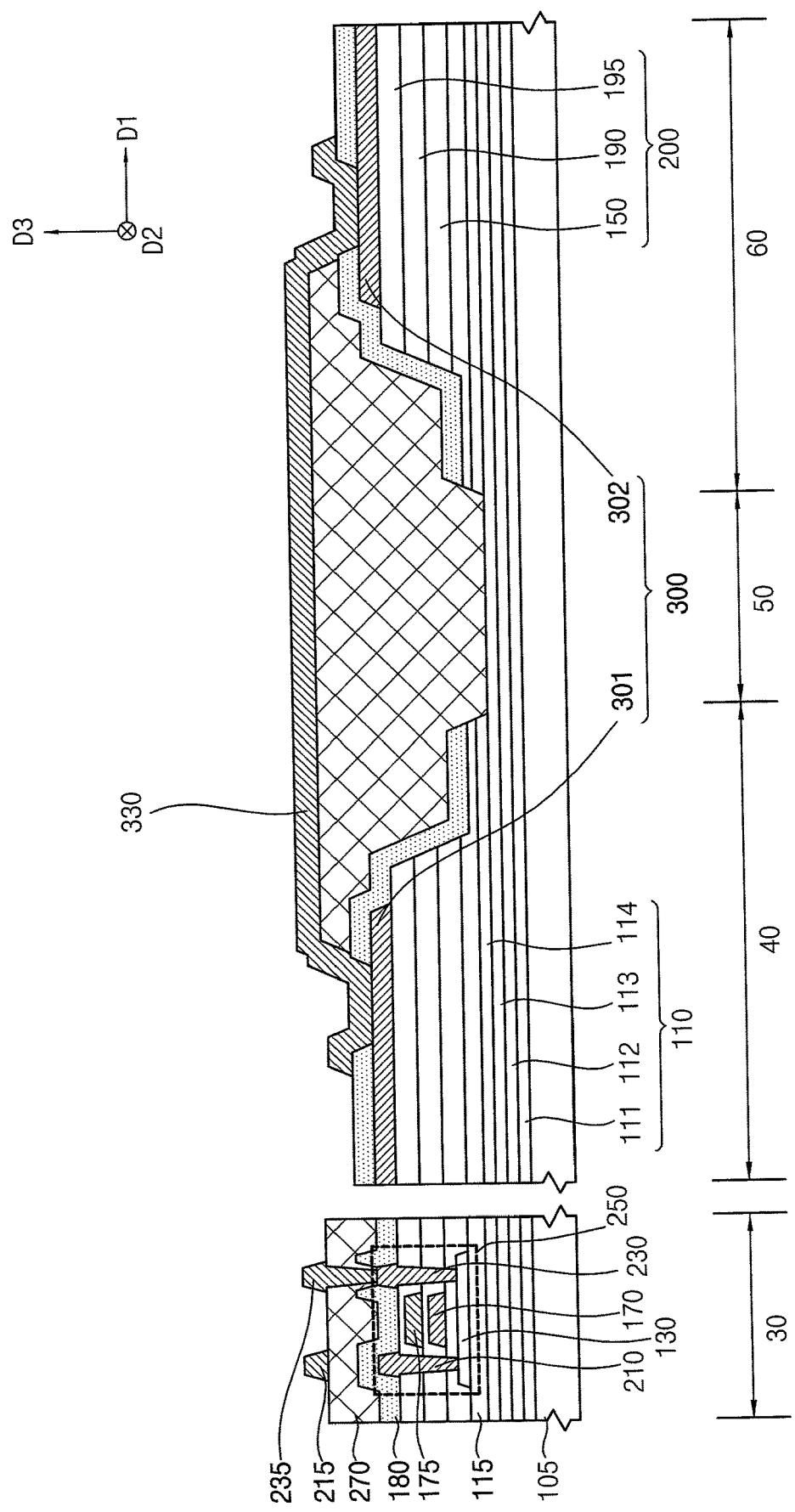

Referring to FIG. 21, the wiring pattern 215 and the connection pattern 235 may be formed in the pixel region 30 on the first planarization layer 270. Scan signals, data signals, light emission signals, initialization signals, power supply voltage may be transferred through the wiring pattern 215. The connection pattern 235 may be in contact with the drain electrode 230 via a contact hole formed by removing a portion of the first planarization layer 270 that is positioned in the pixel region 30. Each of the wiring pattern 215 and the connection pattern 235 may be formed using a metal, an alloy of a metal, a metal nitride, a conductive metal oxide, or transparent conductive materials. These may be used alone or in a desired combination thereof. In an exemplary embodiment of the present invention, each of the wiring pattern 215 and the connection pattern 235 may have a multi-layered structure.

The connection electrode 330 may be formed in a portion of the peripheral region 40, the bending region 50, and a portion of the pad region 60 on the passivation layer 180 and the first planarization layer 270. The connection electrode 330 may be in direct contact with the fan-out wiring 300. For example, the connection electrode 330 may be in direct contact with the first fan-out wiring 301 via the first contact hole in the peripheral region 40, and may be in direct contact with the second fan-out wiring 302 via the second contact hole in the pad region 60. As the connection electrode 330 is electrically connected to the first fan-out wiring 301 and the second fan-out wiring 302, scan signals, data signals, light emission signals, initialization signals, power supply voltage, etc that are applied from an external device may be provided to a pixel structure. In an exemplary embodiment of the present invention, the connection electrode 330, the wiring pattern 215, and the connection pattern 235 may be substantially simultaneously formed using a same material. For example, after a preliminary electrode layer is formed above the entire substrate 110, the wiring pattern 215, the connection pattern 235, and the connection electrode 330 may be substantially simultaneously formed by partially removing the preliminary electrode layer. The connection electrode 330 may be formed using a metal, an alloy of a metal, a metal nitride, a conductive metal oxide, or transparent conductive material. In an exemplary embodiment of the present invention, the connection electrode 330 may have a multi-layered structure.

Figure 22:
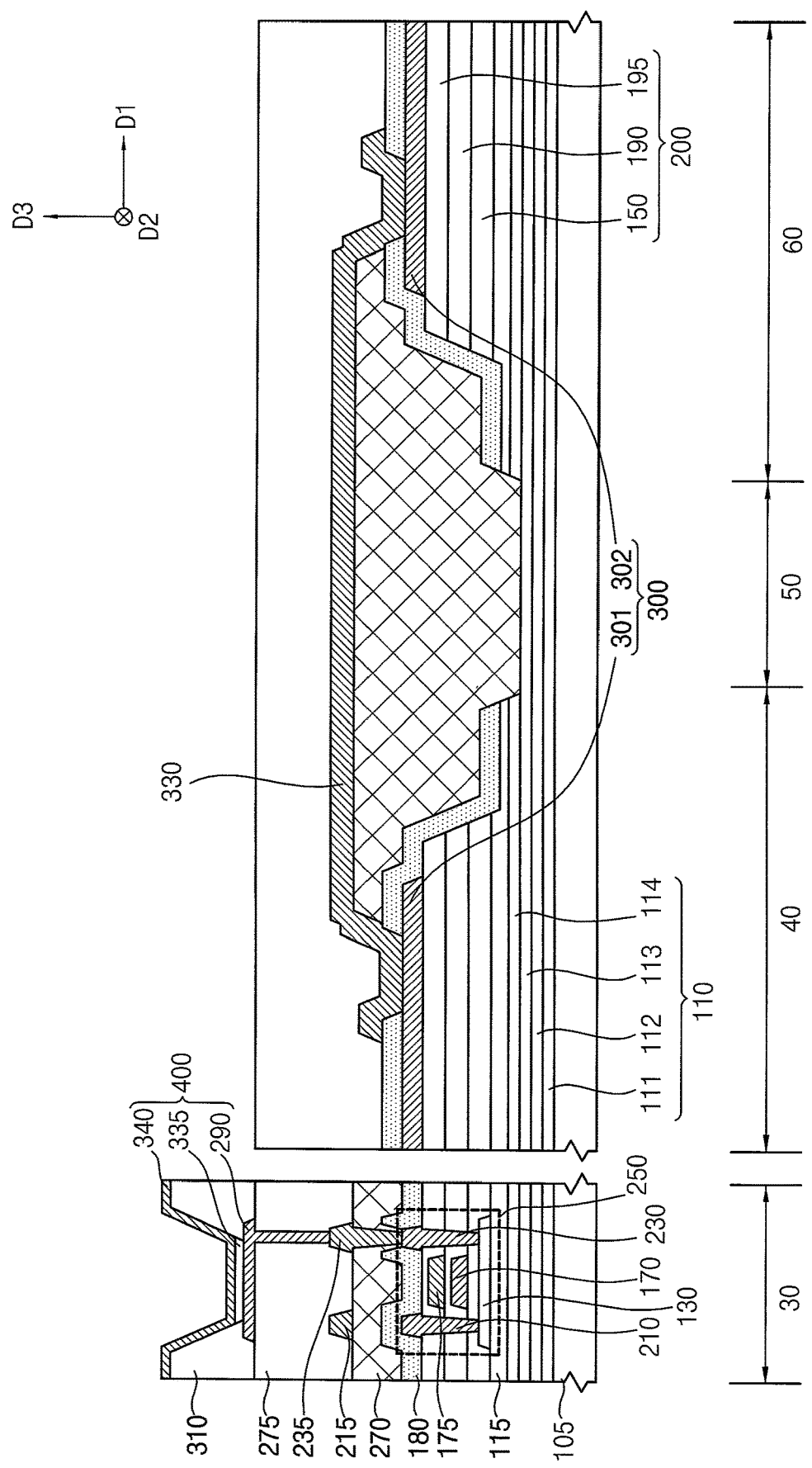

Referring to FIG. 22, the second planarization layer 275 may be formed on the wiring pattern 215, the connection pattern 235, the connection electrode 330, the first planarization layer 270, and the passivation layer 180. The second planarization layer 275 may cover the wiring pattern 215 and the connection pattern 235 in the pixel region 30 on the first planarization layer 270 and extend in the first direction D1, and may cover the connection electrode 330 in a portion of the peripheral region 40, the bending region 50, and a portion of the pad region 60. For example, the second planarization layer 275 may be formed above the entire substrate 110.

The second planarization layer 275 may be relatively thick to sufficiently cover the wiring pattern 215, the connection pattern 235, and the connection electrode 330. As an example, the second planarization layer 275 may have a substantially flat upper surface, and a planarization process may be further performed on the second planarization layer 275 to implement the flat upper surface of the second planarization layer 275. Alternatively, the second planarization layer 275 may be formed as a substantially uniform thickness along a profile of the wiring pattern 215, the connection pattern 235, and the connection electrode 330. Thus, at least one step may be formed above the wiring pattern 215, the connection pattern 235 and/or the connection electrode 330. The second planarization layer 275 may include organic materials or inorganic materials. In an exemplary embodiment of the present invention, the second planarization layer 275 may be formed using organic materials.

The lower electrode 290 may be formed in the pixel region 30 on the second planarization layer 275. The lower electrode 290 may be in contact with the drain electrode 230 via a contact hole formed by removing a portion of the second planarization layer 275. In addition, the lower electrode 290 may be electrically connected to the semiconductor element 250. The lower electrode 290 may be formed using a metal, a metal alloy, a metal nitride, a conductive metal oxide, or transparent conductive materials. These may be used alone or in a desired combination thereof. In an exemplary embodiment of the present invention, the lower electrode 290 may have a multi-layered structure.

The pixel defining layer 310 may be formed in the pixel region 30 on the second planarization layer 275, and may expose a portion of the lower electrode 290. The pixel defining layer 310 may include organic materials or inorganic materials. In an exemplary embodiment of the present invention, the pixel defining layer 310 may be formed using organic materials.

The light emitting layer 335 may be formed in a portion where the portion of the lower electrode 290 is exposed by the pixel defining layer 310. The light emitting layer 335 may be formed using at least one of light emitting materials capable of generating different colors of light (e.g., a red light, a blue light, or a green light) according to sub-pixels. Alternatively, the light emitting layer 335 may generally generate a white light by stacking a plurality of light emitting materials capable of generating different colors of light such as a red light, a green light, or a blue light. As an example, a color filter may be formed on the light emitting layer 335. The color filter may include at least one selected from a red color filter, a green color filter, or a blue color filter. Alternatively, the color filter may include a yellow color filter, a cyan color filter, or a magenta color filter. The color filter may be formed using a photosensitive resin (or color photoresist).

The upper electrode 340 may be formed in the pixel region 30 on the pixel defining layer 310 and the light emitting layer 335. The upper electrode 340 may be formed a metal, a metal alloy, a metal nitride, a conductive metal oxide, or transparent conductive materials. These may be used alone or in a desired combination thereof. In an exemplary embodiment of the present invention, the upper electrode 340 may have a multi-layered structure. Accordingly, the pixel structure 400 including the lower electrode 290, the light emitting layer 335, and the upper electrode 340 may be formed.

Figure 23:
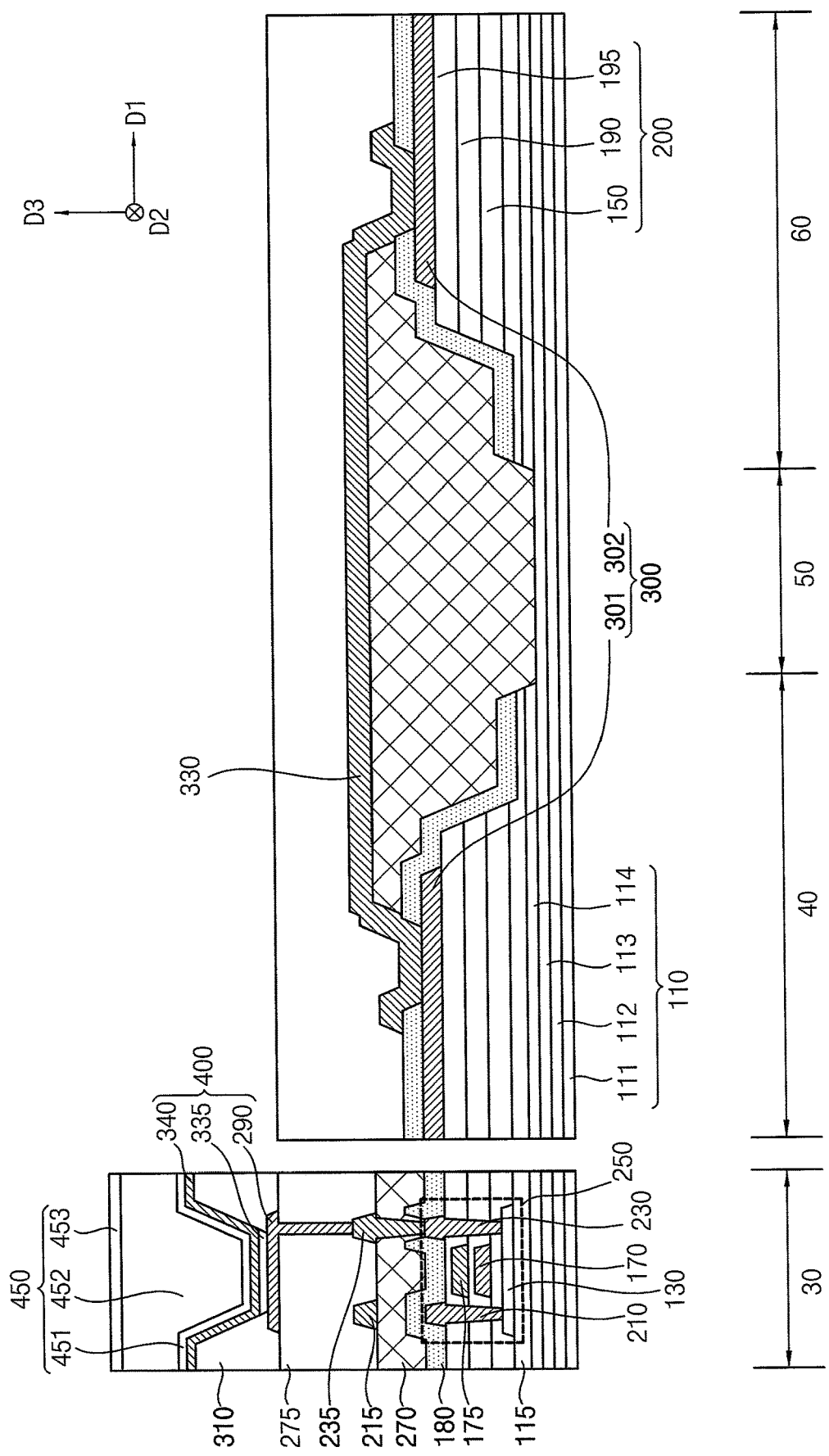

Referring to FIG. 23, the first thin film encapsulation (TFE) layer 451 may be formed in the pixel region 30 on the upper electrode 340. For example, the first TFE layer 451 may be conformally formed on an upper surface of the upper electrode 340 in the pixel region 30. The first TFE layer 451 may cover the upper electrode 340, and may be formed as a substantially uniform thickness along a profile of the upper electrode 340. The first TFE layer 451 may prevent the pixel structure 400 from being deteriorated by the permeation of moisture, water, or oxygen. In addition, the first TFE layer 451 may protect the pixel structure 400 from external impacts. The first TFE layer 451 may be formed using inorganic materials.

The second TFE layer 452 may be formed on the first TFE layer 451. The second TFE layer 452 may increase the flatness of the OLED device, and may protect the pixel structure 400. The second TFE layer 452 may be formed using organic materials.

The third TFE layer 453 may be formed on the second TFE layer 452. The third TFE layer 453 may cover the second TFE layer 452, and may be formed as a substantially uniform thickness along a profile of the second TFE layer 452. The third TFE layer 453 together with the first TFE layer 451 and the second TFE layer 452 may prevent the pixel structure 400 from being deteriorated by the permeation of moisture, water, or oxygen. In addition, the third TFE layer 453 together with the first TFE layer 451 and the second TFE layer 452 may protect the pixel structure 400 from external impacts. The third TFE layer 453 may be formed using inorganic materials. Accordingly, the TFE structure 450 including the first TFE layer 451, the second TFE layer 452, and the third TFE layer 453 may be positioned in the pixel region 30. Alternatively, the TFE structure 450 may have five layers structure where first to fifth TFE layers are stacked or seven layers structure where the first to seventh TFE layers are stacked. After the TFE structure 450 is formed, the rigid glass substrate may be separated from the substrate 110. Accordingly, the OLED device 100 (see, e.g., FIG. 3) may be manufactured.

Figure 24:
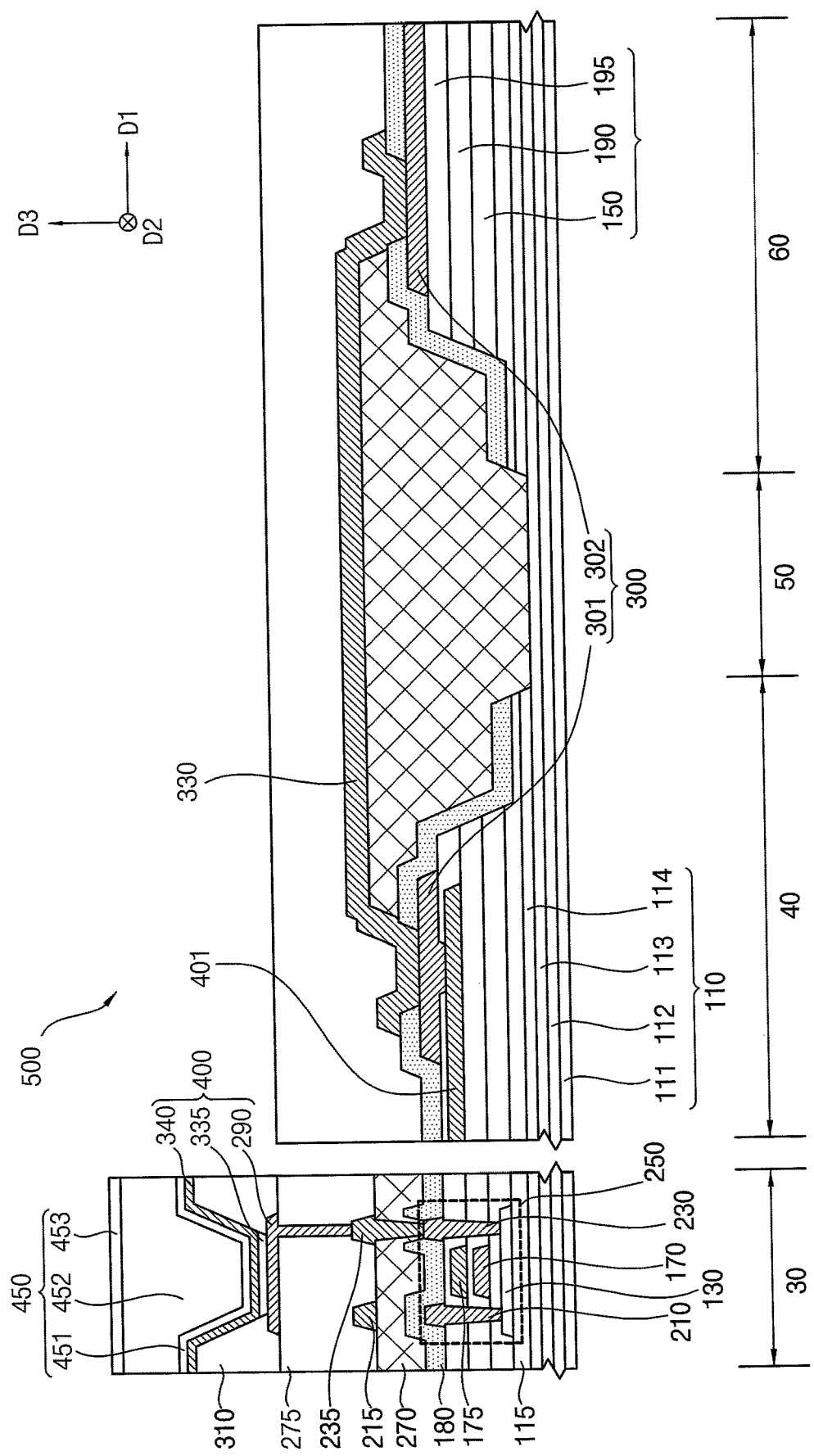
FIG. 24 is a cross-sectional view illustrating an OLED device according to an exemplary embodiment of the present invention.
Figure 25:
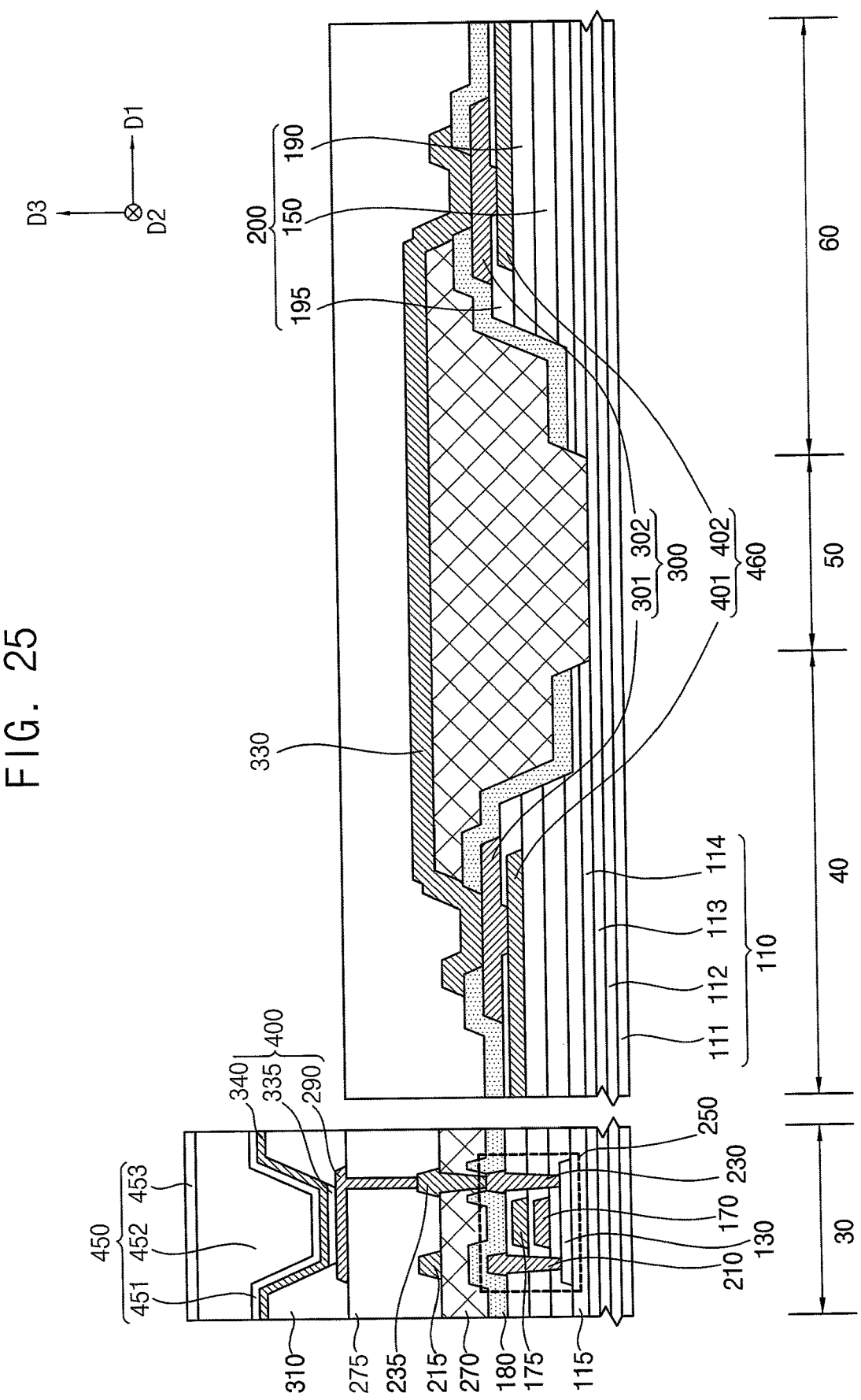
FIG. 25 is cross-sectional views illustrating an example of a fan-out wiring included in the OLED device of FIG. 24.

FIG. 24 is a cross-sectional view illustrating an OLED device according to an exemplary embodiment of the present invention. FIG. 25 is cross-sectional views illustrating an example of a fan-out wiring included in the OLED device of FIG. 24. Referring to FIG. 24, an OLED device 500 may have a configuration substantially the same as or similar to that of the OLED device 100 described above except for a third fan-out wiring 401. Thus, duplicative descriptions for elements that are substantially the same as or similar to elements described above (e.g., with reference to FIG. 3) may be omitted below.

Referring to FIG. 24, the OLED device 500 may include the substrate 110, the buffer layer 115, the insulation layer structure 200, the semiconductor element 250, the pixel structure 400, the fan-out wiring 300 (e.g., a conductive pattern), the third fan-out wiring 401, the passivation layer 180, the first planarization layer 270, the second planarization layer 275, the connection electrode 330, the wiring pattern 215, the connection pattern 235, the pixel defining layer 310, and the thin film encapsulation (TFE) structure 450. The substrate 110 may include the first organic layer 111, the first barrier layer 112, the second organic layer 113, and the second barrier layer 114, and the substrate 110 may include the pixel region 30, the peripheral region 40 (e.g., a peripheral region 40 positioned between the pixel region 30 and the bending region 50), the bending region 50, and the pad region 60 (refer to FIG. 1A). In addition, the insulation layer structure 200 may include the gate insulation layer 150, the first insulating interlayer 190, and the second insulating interlayer 195, and the semiconductor element 250 may include the active layer 130, the first gate electrode 170, the second gate electrode 175, the source electrode 210, and the drain electrode 230. Further, the fan-out wiring 300 may include the first fan-out wiring 301 (e.g., a first conductive pattern) and the second fan-out wiring 302 (e.g., a second conductive pattern), and the pixel structure 400 may include the lower electrode 290, the light emitting layer 335, and the upper electrode 340. The TFE structure 450 may include the first TFE layer 451, the second TFE layer 452, and the third TFE layer 453.

The third fan-out wiring 401 may be disposed on the first insulating interlayer 190. The third fan-out wiring 401 may extend along the first direction D1 in the peripheral region 40 on the first insulating interlayer 190, and may be electrically connected to the pixel structure 400 that is disposed in the pixel region 30. The third fan-out wiring 401 and the second gate electrode 175 may be substantially simultaneously formed using a same material. For example, the third fan-out wiring 401 may include a metal, an alloy of a metal, a metal nitride, a conductive metal oxide, or transparent conductive materials.

The first fan-out wiring 301 may be disposed in the peripheral region 40 on the insulation layer structure 200, and may be electrically connected to the third fan-out wiring 401 via a contact hole formed by removing a portion of the second insulating interlayer 195 that is positioned in the peripheral region 40. The first fan-out wiring 301 of FIG. 24 may serve as a connection wiring that electrically connects the connection electrode 330 and the third fan-out wiring 401. Accordingly, a wiring resistance of the connection electrode 330 may be reduced.

In addition, referring to FIG. 25, the OLED device 100 may further include an auxiliary fan-out wiring 460. The auxiliary fan-out wiring 460 may include a third fan-out wiring 401 and a fourth fan-out wiring 402. The second fan-out wiring 302 (e.g., a second conductive pattern) may be disposed in the pad region 60 on the insulation layer structure 200, and may be electrically connected to the fourth fan-out wiring 402 via a contact hole formed by removing a portion of the second insulating interlayer 195 that is positioned in the pad region 60. The second fan-out wiring 302 (see, e.g., FIG. 25) may serve as a connection wiring that electrically connects the connection electrode 330 and the fourth fan-out wiring 402. Accordingly, a wiring resistance of the connection electrode 330 may be further reduced.

Figure 26:
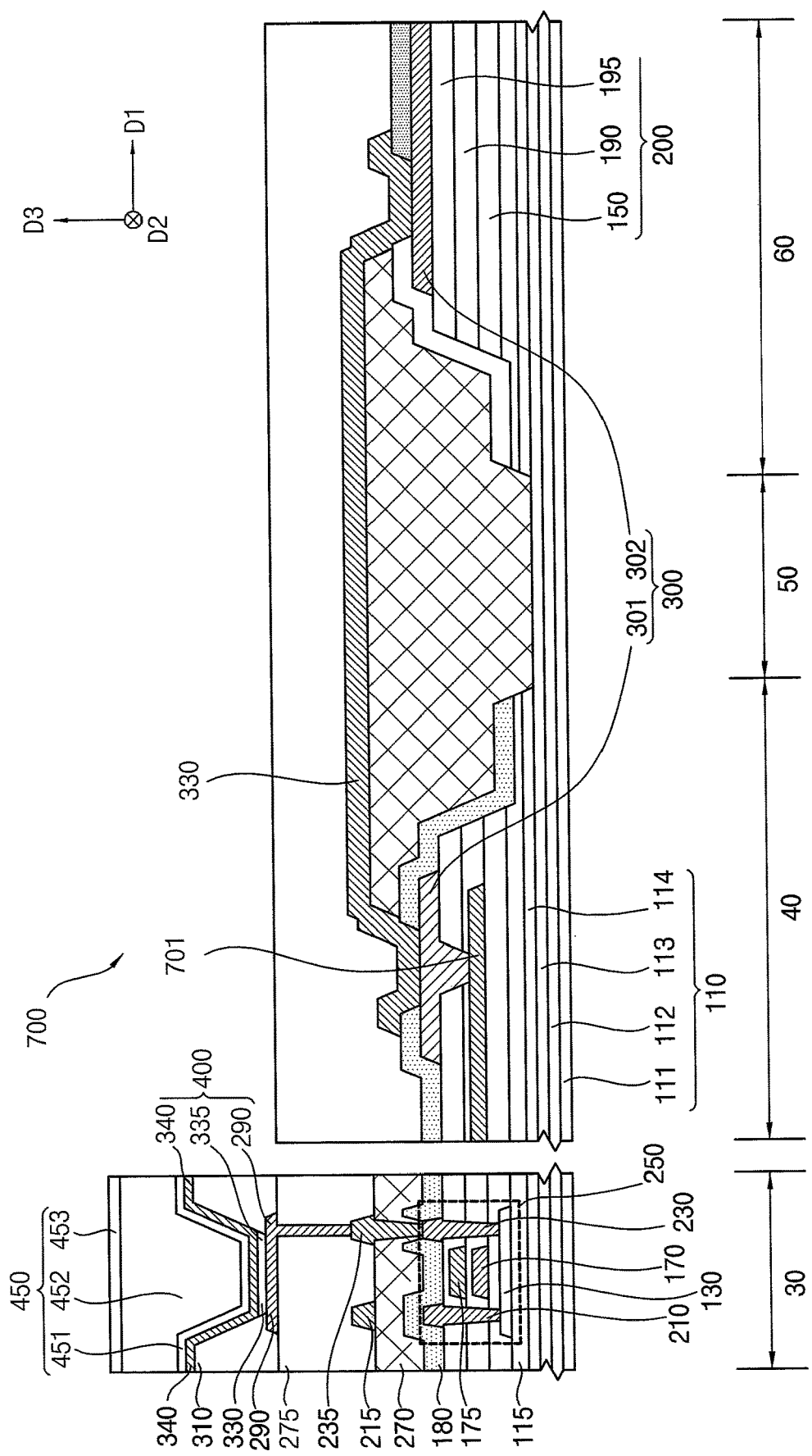
FIG. 26 is a cross-sectional view illustrating an OLED device according to an exemplary embodiment of the present invention.

FIG. 26 is a cross-sectional view illustrating an OLED device according to an exemplary embodiment of the present invention. Referring to FIG. 26, an OLED device 700 may have a configuration substantially the same as or similar to that of an OLED device 100 described above except for a fifth fan-out wiring 701. Thus, duplicative descriptions for elements that are substantially the same as or similar to elements described above (e.g., with reference to FIG. 3) may be omitted below.

Referring to FIG. 26, the OLED device 700 may include the substrate 110, the buffer layer 115, the insulation layer structure 200, the semiconductor element 250, the pixel structure 400, the fan-out wiring 300 (e.g., a conductive pattern), the fifth fan-out wiring 701, the passivation layer 180, the first planarization layer 270, the second planarization layer 275, the connection electrode 330, the wiring pattern 215, the connection pattern 235, the pixel defining layer 310, and the thin film encapsulation (TFE) structure 450. The substrate 110 may include the pixel region 30, the peripheral region 40 (e.g., a peripheral region 40 positioned between the pixel region 30 and the bending region 50), the bending region 50, and the pad region 60 (see, e.g., FIG. 1A). In addition, the insulation layer structure 200 may include the gate insulation layer 150, the first insulating interlayer 190, and the second insulating interlayer 195, and the semiconductor element 250 may include the active layer 130, the first gate electrode 170, the second gate electrode 175, the source electrode 210, and the drain electrode 230. Further, the fan-out wiring 300 may include the first fan-out wiring 301 (e.g., a first conductive pattern) and the second fan-out wiring 302 (e.g., a second conductive pattern).

The fifth fan-out wiring 701 may be disposed on the gate insulation layer 150. The fifth fan-out wiring 701 may extend along the first direction D1 in the peripheral region 40 on the gate insulation layer 150, and may be electrically connected to the pixel structure 400 that is disposed in the pixel region 30. The fifth fan-out wiring 701 and the first gate electrode 170 may be substantially simultaneously formed using a same material. For example, the fifth fan-out wiring 701 may include a metal, an alloy of a metal, a metal nitride, a conductive metal oxide, or transparent conductive materials.

The first fan-out wiring 301 may be positioned in the peripheral region 40 on the insulation layer structure 200, and may be electrically connected to the fifth fan-out wiring 701 via contact holes formed by removing a portion of the first insulating interlayer 190 and a portion of the second insulating interlayer 195 that are positioned in the peripheral region 40. The first fan-out wiring 301 of FIG. 26 may serve as a connection wiring that electrically connects the connection electrode 330 and the third fan-out wiring 401. Accordingly, a wiring resistance of the connection electrode 330 may be reduced.

Figure 27:
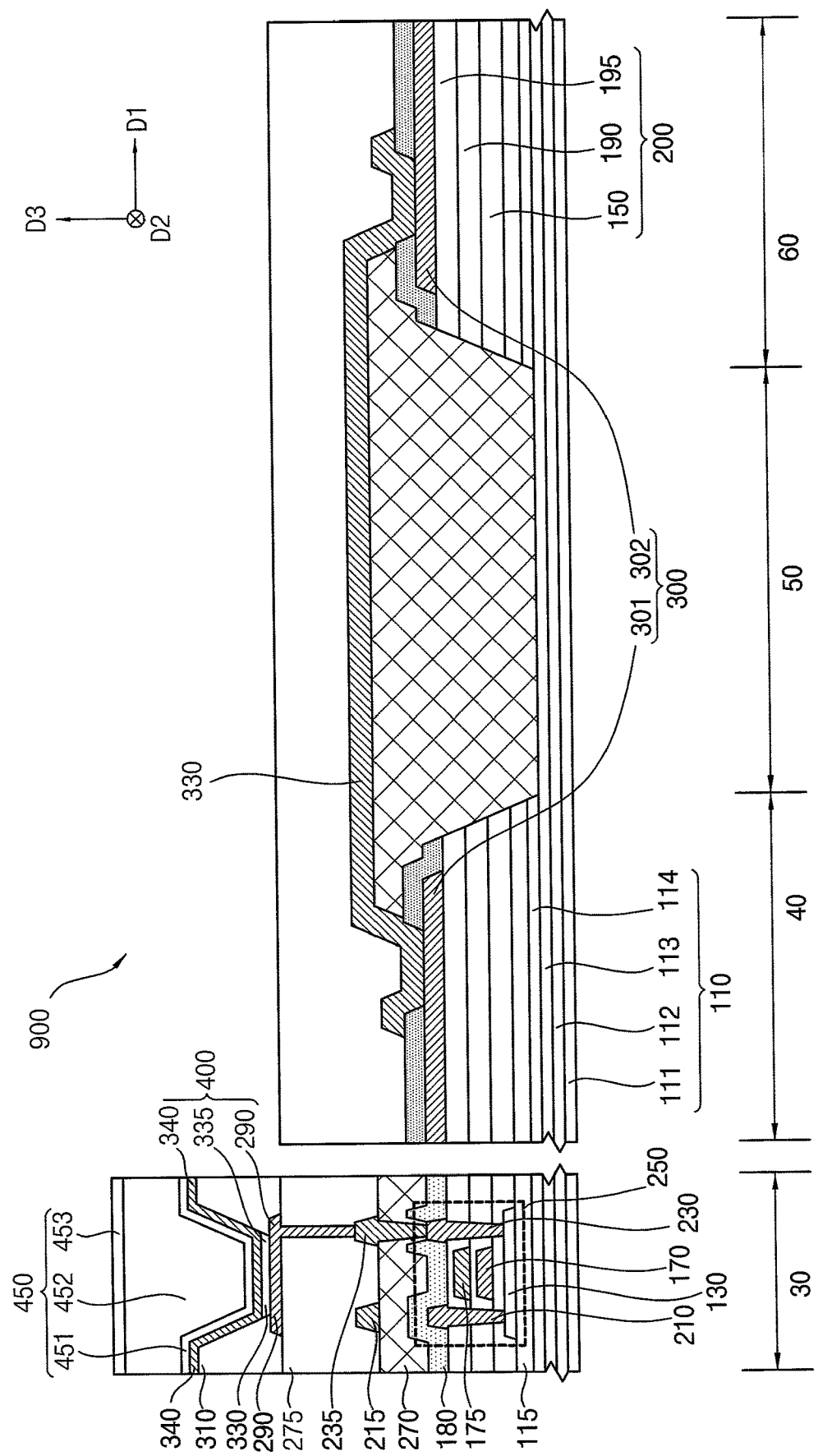
FIG. 27 is a cross-sectional view illustrating an OLED device according to an exemplary embodiment of the present invention.

FIG. 27 is a cross-sectional view illustrating an OLED device according to an exemplary embodiment of the present invention. Referring to FIG. 27, an OLED device 900 may have a configuration substantially the same as or similar to that of the OLED device 100 described above except for a shape of insulation layers. Thus, duplicative descriptions for elements that are substantially the same as or similar to elements described above (e.g., with reference to FIG. 3) may be omitted below.

Referring to FIG. 27, the OLED device 900 may include the substrate 110, the buffer layer 115, the insulation layer structure 200, the semiconductor element 250, the pixel structure 400, the fan-out wiring 300, the passivation layer 180, the first planarization layer 270, the second planarization layer 275, the connection electrode 330, the wiring pattern 215, the connection pattern 235, the pixel defining layer 310, and the thin film encapsulation (TFE) structure 450. The substrate 110 may include the first organic layer 111, the first barrier layer 112, the second organic layer 113, and the second barrier layer 114, and may include the pixel region 30, the peripheral region 40 (e.g., a peripheral region 40 positioned between the pixel region 30 and the bending region 50), the bending region 50, and the pad region 60 (see, e.g., FIG. 1A). In addition, the insulation layer structure 200 may include the gate insulation layer 150, the first insulating interlayer 190, and the second insulating interlayer 195, and the semiconductor element 250 may include the active layer 130, the first gate electrode 170, the second gate electrode 175, the source electrode 210, and the drain electrode 230. Further, the fan-out wiring 300 may include the first fan-out wiring 301 and the second fan-out wiring 302, and the pixel structure 400 may include the lower electrode 290, the light emitting layer 335, and the upper electrode 340. The TFE structure 450 may include the first TFE layer 451, the second TFE layer 452, and the third TFE layer 453.

The buffer layer 115 may be disposed on the substrate 110. In an exemplary embodiment of the present invention, the buffer layer 115 may be positioned in the pixel region 30 and the peripheral region 40 on the entire substrate 110, and may expose an upper surface of second organic layer 113 included in the substrate 110 that is positioned in the bending region 50.

The insulation layer structure 200 may be positioned above the buffer layer 115. In an exemplary embodiment of the present invention, the insulation layer structure 200 may be positioned in the pixel region 30 and the peripheral region 40 on the entire substrate 110, and may expose an upper surface of second organic layer 113 that is positioned in the bending region 50.

The passivation layer 180 may be disposed on the source electrode 210, the drain electrode 230, and the fan-out wiring 300. In an exemplary embodiment of the present invention, the passivation layer 180 may cover the source electrode 210 and the drain electrode 230 in the pixel region 30 on the second insulating interlayer 195, may extend in the first direction D1. In addition, the passivation layer 180 may cover the fan-out wiring 300 in the peripheral region 40 and the pad region 60, and may expose an upper surface of second organic layer 113 that is positioned in the bending region 50.

As an example, a distance extending in the first direction D1 of the bending region 50 may be increased. For example, the OLED device 900 may be applied to a flexible display device having a relatively large bending radius of the bending region 50.

The present invention may be applied to various display devices including an OLED device. For example, the present invention may be applied to vehicle-display device, a ship-display device, an aircraft-display device, portable communication devices, display devices for display or for information transfer, or a medical-display device.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light emitting display (OLED) device, comprising:
a substrate comprising a display region including a pixel region and a peripheral region, a pad region, and a bending region that is positioned between the display region and the pad region, the substrate including a groove in the bending region:
a buffer layer on the substrate, the buffer layer including a step portion in a portion that is located adjacent to the groove:
pixel structures in the pixel region on the buffer layer;
an insulation layer structure on the buffer layer, the insulation layer structure having a side surface on the buffer layer so that the insulation layer is not overlapped with the step portion of the buffer layer;
a fan-out wring in the peripheral region and the pad region, which are located adjacent to the bending region, on the insulation layer structure;
a passivation layer on the fan-out wiring and side walls of the insulation layer structure; and
a connection electrode in the bending region on the substrate and electrically connected to the fan-out win in the peripheral region and the pad region,
wherein the passivation layer is in direct contact with the side surface of the insulation layer structure,
wherein a portion of the passivation layer is arranged between the insulation layer structure and the connection electrode, and
wherein the passivation layer exposes a side surface of the groove of the substrate.

2. The OLED device of claim 1, wherein the buffer layer further includes a first opening exposing the groove of the substrate,
wherein the insulation layer structure includes a second opening exposing the groove of the substrate and the step portion of the buffer layer, and
wherein the passivation layer includes a third opening exposing the groove of the substrate.

3. The OLED device of claim 2, wherein the second opening overlaps the first and third openings along a direction orthogonal to the upper surface of the substrate, and
wherein a width of the second opening along a direction parallel to the upper surface of the substrate is greater than widths of the first and third openings along the direction parallel to the upper surface of the substrate.

4. The OLED device of claim 3, wherein the width of the first opening is less than the width of the third opening along the direction parallel to the upper surface of the substrate.

5. The OLED device of claim 1, wherein the fan-out wiring exposes the groove of the substrate and the step portion of the buffer layer.

6. The OLED device of claim 1, wherein the side walls of the insulation layer structure is located adjacent to the bending region, and the passivation layer is disposed on the side walls of the insulation layer structure and the step portion of the buffer layer.

7. The OLED device of claim 1, wherein the connection electrode is in direct contact with the fan-out wiring.

8. The OLED device of claim 1, wherein the passivation layer includes a first contact hole that is positioned in the peripheral region and a second contact hole that is positioned in the pad region, and
wherein the fan-out wiring is in direct contact with the connection electrode through the first and second contact holes.

9. The OLED device of claim 1, wherein a first portion of the buffer layer is protruded from the side walls of the insulation layer structure along a direction parallel to the upper surface of the substrate, and wherein a second portion of the buffer layer overlaps the insulation layer structure along a direction orthogonal to the upper surface of the substrate,
wherein the first portion of the buffer layer corresponds to the step portion of the buffer layer.

10. The OLED device of claim 9, wherein a thickness of the first portion of the buffer layer along the direction orthogonal to the upper surface of the substrate is less than a thickness of the second portion of the buffer layer along the direction orthogonal to the upper surface of the substrate.

11. The OLED device of claim 10, wherein the buffer layer includes a first inorganic layer disposed on the substrate and a second inorganic layer disposed on the first inorganic layer, and wherein the first portion of the buffer layer includes the first inorganic layer, and the second portion of the buffer layer includes the first and second inorganic layers.

12. The OLED device of claim 11, wherein the first inorganic layer includes silicon nitride, and the second inorganic layer includes silicon oxide.

13. The OLED device of claim 1, wherein the fan-out wiring includes:
a first fan-out wiring positioned in the peripheral region; and
a second fan-out wiring positioned in the pad region,
wherein the first fan-out wiring extends in a first direction, and is electrically connected to the pixel structure, and
wherein the second fan-out wiring extends in the first direction in the pad region, and is electrically connected to the external device.

14. The OLED device of claim 1, further comprising:
a semiconductor element positioned between the buffer layer and the pixel structure,
wherein the semiconductor element includes:
an active layer disposed on the buffer layer;
a first gate electrode disposed on the active layer;
a second gate electrode disposed on the first gate electrode; and
source and drain electrode disposed on the second gate electrode.

15. The OLED device of claim 14, wherein the insulation layer structure includes:
a gate insulation layer disposed on upper and side surfaces of the active layer in the pixel region above the buffer layer and extending in a first direction, the gate insulation layer exposing the upper surface of the substrate in the bending region;
a first insulating interlayer disposed on upper and side surfaces of the first gate electrode in the pixel region above the gate insulation layer and extending in the first direction, the first insulating interlayer exposing the upper surface of the substrate in the bending region; and
a second insulating interlayer disposed on upper and side surfaces of the second gate electrode in the pixel region above the first insulating interlayer and extending in the first direction, the second insulating interlayer exposing the upper surface of the substrate in the bending region.

16. The OLED device of claim 15, wherein the passivation layer is disposed on upper and side surfaces of the source and drain electrodes above the second insulating interlayer and extends in the first direction, and
wherein the passivation layer is disposed on the fan-out wiring in the peripheral region adjacent to the bending region, and exposes the upper surface of the substrate in the bending region.

17. The OLED device of claim 15, wherein the source and drain electrodes and the fan-out wiring are located at a same layer.

18. The OLED device of claim 15, wherein the pixel structure includes:
a lower electrode disposed on the semiconductor element;
a light emitting layer disposed on the lower electrode; and
an upper electrode disposed on the light emitting layer.

19. The OLED device of claim 18, further comprising:
a first planarization layer disposed on the passivation layer in the pixel region, the first planarization layer being positioned between the connection electrode and the substrate in the bending region, the peripheral region that is adjacent to the bending region, and the pad region;
a wiring pattern and a connection pattern positioned in the pixel region on the first planarization layer; and
a second planarization layer disposed on upper and side surfaces of the wiring pattern and the connection pattern in the pixel region on the first planarization layer and extending in the first direction, the second planarization layer being disposed on the connection electrode.

20. The OLED device of claim 19, wherein the lower electrode is electrically connected to the drain electrode through the connection pattern.

21. The OLED device of claim 1, further comprising:
a thin film encapsulation structure disposed on the pixel structure, wherein the thin film encapsulation structure includes:
a first thin film encapsulation layer disposed on the pixel structure and including an inorganic material;
a second thin film encapsulation layer disposed on the first thin film encapsulation layer and including an organic material; and
a third thin film encapsulation layer disposed on the second thin film encapsulation layer and including an inorganic material.

22. An organic light emitting display (OLED) device, comprising:
a substrate comprising a display region including a pixel region and a peripheral region, a pad region, and a bending region that is positioned between the display region and the pad region, the substrate including a first step portion in a portion that is located adjacent to the bending region;
a buffer layer on the substrate, the buffer layer including a second step portion in a portion that is located adjacent to the first step portion;
pixel structures in the pixel region on the buffer layer;

an insulation layer structure on the buffer layer, having a side surface on the buffer layer so that the insulation layer structure is not overlapped with the second step portion;
a fan-out wiring in the peripheral region and the pad region, which are located adjacent to the bending region, on the insulation layer structure;
a passivation layer on the fan-out wiring and side walls of the insulation layer structure; and
a connection electrode in the bending region on the substrate and electrically connected to the fan-out wiring in the peripheral region and the pad region,
wherein the passivation layer is in direct contact with the side surface of the insulation layer structure,
wherein a portion of the passivation layer is arranged between the insulation layer structure and the connection electrode, and
wherein the passivation layer exposes a side surface of the first step portion.

23. The OLED device of claim 22, wherein the buffer layer further includes a first opening exposing the first step portion of the substrate,
wherein the insulation layer structure includes a second opening exposing the first step portion of the substrate and the second step portion of the buffer layer, and
wherein the passivation layer includes a third opening exposing the first step portion of the substrate.

24. The OLED device of claim 22, wherein the fan-out wiring exposes the first step portion of the substrate and the second step portion of the buffer layer.

25. The OLED device of claim 22, wherein the insulation layer structure is not overlapped with the second step portion.

26. The OLED device of claim 22, wherein the side walls of the insulation layer structure is located adjacent to the bending region, and the passivation layer is disposed on the side walls of the insulation layer structure and the step portion of the buffer layer.

27. The OLED device of claim 22, wherein the side walls of the insulation layer structure is located adjacent to the bending region, and the passivation layer is disposed on the side walls of the insulation layer structure and the second step portion of the buffer layer.

28. The OLED device of claim 22, wherein the connection electrode is in direct contact with the fan-out wiring.

29. The OLED device of claim 22, wherein the passivation layer includes a first contact hole that is positioned in the peripheral region and a second contact hole that is positioned in the pad region, and
wherein the fan-out wiring is in direct contact with the connection electrode through the first and second contact holes.

30. The OLED device of claim 22, wherein the substrate includes:
a first organic layer;
a first barrier layer disposed on the first organic layer;
a second organic layer disposed on the first barrier layer; and
a second barrier layer disposed on the second organic layer.

31. The OLED device of claim 30, wherein the second barrier layer includes a fourth opening that exposes an upper surface of the second organic layer in the bending region, and wherein the fourth opening is concentric with the first opening of the buffer layer.

32. The OLED device of claim 31, further comprising:
a first planarization layer positioned between the substrate and the connection electrode,
wherein the first planarization layer is direct contact with the upper surface of the second organic layer in the bending region.

33. The OLED device of claim 30, wherein the first and second barrier layers each include silicon oxide, and the first and second organic layers each include a polyimide-based resin.

34. An organic light emitting display (OLED) device, comprising:
a substrate comprising a display region including a pixel region and a peripheral region surrounding the pixel region, a pad region that is spaced apart from the display region, and a bending region that is positioned between the display region and the pad region;
a buffer layer disposed on the substrate, the butter layer including a first opening;
pixel structures in the pixel region on the buffer layer;
an insulation layer structure disposed on the buffer layer, the insulation layer structure including a second opening having a side surface on the buffer layer so that the second opening exposes a portion of the buffer layer and the first opening;
a fan-out wiring positioned in the peripheral region and the pad region on the insulation layer structure;
a passivation layer disposed on the fan-out wiring and side walls of the insulation layer structure that is positioned adjacent to the bending region; and
a connection electrode in the bending region on the substrate and electrically connected to the fan-out wiring in the peripheral region and the pad region,
wherein the passivation layer is in direct contact with a side surface of the second opening of the insulation layer structure,
wherein a portion of the passivation layer is arranged between the insulating layer structure and the connection electrode, and
wherein the passivation layer exposes a side surface of the second opening.

35. The OLED device of claim 34, wherein the first opening of the buffer layer exposes an upper surface of the substrate that is positioned in the bending region.

36. The OLED device of claim 34, wherein the second opening of the insulation layer structure exposes the upper surface of the substrate that is positioned in the bending region and a first portion of the buffer layer that is positioned adjacent to the bending region.

37. The OLED device of claim 34, wherein the fan-out wiring exposes the upper surface of the substrate and the first portion of the buffer layer.

38. The OLED device of claim 34, wherein the passivation layer is disposed on the first portion of the buffer layer, and the passivation layer includes a third opening exposing the upper surface of the substrate that is positioned in the bending region.

39. The OLED device of claim 34, wherein the connection electrode is positioned above the substrate, the connection electrode being in direct contact with the fan-out wiring, and the connection electrode being electrically connected to the pixel structure and an external device.

40. The OLED device of claim 39, wherein the passivation layer includes a first contact hole that is positioned in the peripheral region and a second contact hole that is positioned in the pad region, and the fan-out wiring is in direct contact with the connection electrode through the first and second contact holes.

\* \* \* \* \*